US006835888B2

(12) United States Patent
Sano et al.

(10) Patent No.: US 6,835,888 B2
(45) Date of Patent: Dec. 28, 2004

(54) STACKED PHOTOVOLTAIC DEVICE

(75) Inventors: Masafumi Sano, Soraku-gun (JP); Tetsuro Nakamura, Nara-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/422,171

(22) Filed: Apr. 23, 2003

(65) Prior Publication Data
US 2003/0213515 A1 Nov. 20, 2003

Related U.S. Application Data

(60) Continuation of application No. 10/137,347, filed on May 3, 2002, now abandoned, which is a division of application No. 09/257,054, filed on Feb. 25, 1999, now Pat. No. 6,399,873.

(30) Foreign Application Priority Data

Feb. 26, 1998 (JP) .......................................... 10-044731

(51) Int. Cl.$^7$ ........................................... H01L 31/075
(52) U.S. Cl. ...................... 136/249; 136/258; 136/255; 136/261; 257/458; 257/464; 257/461
(58) Field of Search ................................ 136/249, 258, 136/255, 261; 257/458, 454, 461

(56) References Cited

U.S. PATENT DOCUMENTS

| | | | | |
|---|---|---|---|---|
| 2,949,498 | A | | 8/1960 | Jackson ...................... 136/244 |
| 5,421,909 | A | * | 6/1995 | Ishikawa et al. ............ 136/256 |
| 6,162,988 | A | * | 12/2000 | Okabe et al. ................ 136/258 |
| 6,180,870 | B1 | * | 1/2001 | Sano et al. .................. 136/258 |
| 6,399,873 | B1 | * | 6/2002 | Sano et al. .................. 136/249 |
| 2002/0011264 | A1 | | 1/2002 | Saito ........................... 136/258 |
| 2003/0079771 | A1 | * | 5/2003 | Sano et al. .................. 136/249 |

FOREIGN PATENT DOCUMENTS

| EP | 895291 | | 2/1999 |
|---|---|---|---|
| EP | 895291 A2 | * | 2/1999 |

OTHER PUBLICATIONS

J. Meier, et al., "Intrinsic Microcrystalline Silicon ($\mu$c–Si:H)—A Promising New Thin Film Solar Cell Material", First World Conference On Photovoltaic Energy Conversion, vol. 1, pp. 409–412 (1994).

K. Miyachi, et al., "Fabrication of Single Pin Type Solar Cells With A High Conversion Efficiency of 13.0%", Eleventh E.C. Photovoltaic Solar Energy Conference, pp. 88–91 (1992).

K. Yamamoto et al., "Enhancement of optical absorption for below 5$\mu$m–thin film poly–Si solar cell with STAR structure on glass substrate", 14$^{th}$ Eur. Photovoltaic Solar Ener. Conf., Barcelona, Spain, pp. 1018–1021 (1997).

K. Zweibel, et al., "The DOE/SERI Polycrystalline Thin Film Subcontract Program", Twentieth IEEE Photovoltaic Specialists Conference, vol. II, pp. 1469–1476 (1988).

* cited by examiner

Primary Examiner—Alan Diamond
(74) Attorney, Agent, or Firm—Fitzpatrick, Cella, Harper & Scinto

(57) ABSTRACT

A stacked photovoltaic device comprises at least three p-i-n junction constituent devices superposed in layers, each having a p-type layer, an i-type layer and an n-type layer which are formed of silicon non-single crystal semiconductors. An amorphous silicon layer is used as the i-type layer of a first p-i-n junction, a microcrystalline silicon layer is used as the i-type layer of a second p-i-n junction and a microcrystalline silicon layer is used as the i-type layer of a third p-i-n junction, the first to third layers being in order from the light incident side. In this way, a stacked photovoltaic device can be provided which is practical and low-cost and yet has high reliability and high photoelectric conversion efficiency.

6 Claims, 5 Drawing Sheets

STACKED PHOTOVOLTAIC DEVICE

This application is a continuation of application Ser. No. 10/137,347, filed May 3, 2002, now abandoned, which is a division of application Ser. No. 09/257,054, filed Feb. 25, 1999, now U.S. Pat. No. 6,399,873.

BACKGROUND OF THE INVENTION

1. Field of the Invention

This invention relates to a stacked photovoltaic device, such as a solar cell and a photosensor, formed by superposing at least three p-i-n junction constituent devices, each having a p-type layer, an i-type layer and an n-type layer which are formed of silicon non-single crystal semiconductors.

2. Related Background Art

Photovoltaic devices which are photoelectric conversion devices that convert sunlight into electric energy are currently in wide use as public-purpose power sources for low-power supply, such as in electronic calculators and wrist watches. Such devices attract attention as practical future substitutes for petroleum fuel such as oil and coal.

Photovoltaic devices utilize photovoltaic force attributable to a p-n junction or the like of semiconductor devices. Semiconductors such as silicon absorb sunlight to produce photocarriers of electrons and holes. The photocarriers are caused to drift by the aid of an internal electric field at the p-n junction or the like and taken outside.

Such photovoltaic devices are produced chiefly by using semiconductor fabrication processes. Stated specifically, a silicon single crystal whose valence electrons have been controlled to be p-type or n-type is produced by a crystal growth process as exemplified by the CZ (Czokralski) process. The single crystal thus produced is sliced to prepare a silicon wafer about 300 μm thick. A layer having different conductivity type is further superposed by, e.g., diffusing a valence electron control agent so as to have a conductivity type opposite to that of the wafer to provide a p-n junction.

Now, at present, from the viewpoint of reliability and photoelectric conversion efficiency, single-crystal silicon is employed in most photovoltaic devices having been put into practical use. However, since the production of such single-crystal silicon photovoltaic devices makes use of the semi-conductor production process as stated above, it entails a high production cost.

The single-crystal silicon photovoltaic devices have additional disadvantages in that the single-crystal silicon has a small optical absorption coefficient because of its indirect transition and hence must be formed in a thickness of at least 50 μm in order to absorb more sunlight and in that it has a band gap of about 1.1 eV, which is narrower than 1.5 eV suited for photovoltaic devices and hence cannot utilize short wavelength components effectively.

Even if polycrystalline silicon is used to achieve a cost reduction, the problem of indirect transition still remains, and the photovoltaic devices cannot be made to have a smaller thickness. In addition, polycrystalline silicon also has problems ascribable to grain boundaries.

Moreover, since it is crystalline, large area wafers cannot be produced, making it difficult to make devices large in area. Hence, in order to withdraw a large electric power, unit devices must be connected by wiring in series or in parallel. Also, expensive packaging is necessary in order to protect photovoltaic devices from mechanical damage caused by various weather conditions when they are used outdoors. This makes production cost higher per unit quantity of electricity generation than existing electricity generation systems. Such problems remain unsettled.

Under such circumstances, for the advancement of bringing photovoltaic devices into practical use for electric power, it is an important technical subject to achieve cost reduction and make devices large in area. Various studies have been conducted, and research has been made on materials such as low-cost materials and materials with high photoelectric conversion efficiency.

Such materials for photovoltaic devices may include tetrahedral type amorphous semiconductors such as amorphous silicon, amorphous silicon germanium and amorphous silicon carbide and compound semiconductors of Group II or VI such as CdS and $Cu_2S$ and those of Group III or V such as GaAs and GaAlAs. In particular, thin-film photovoltaic devices in which amorphous semiconductors are used in photovoltaic layers have advantages in that they can provide films having larger area than single-crystal photovoltaic devices, can be formed in a small layer thickness and can be deposited on any desired substrate materials; thus, they are regarded as promising.

However, the photovoltaic devices making use of amorphous semiconductors still have problems with respect to improvement in photoelectric conversion efficiency and improvement in reliability.

As a means for improving the photoelectric conversion efficiency of the photovoltaic devices making use of amorphous semiconductors, for example, the band gap is made narrower so that the sensitivity to long wavelength light can be made higher. More specifically, since amorphous silicon has a band gap of about 1.7 eV, it cannot absorb light having a wavelength of 700 nm or longer and cannot be utilized effectively. Accordingly, employing narrow band gap materials having a sensitivity to long wavelength light is studied.

Such materials may include amorphous silicon germanium, whose band gap can be changed arbitrarily from about 1.3 eV to about 1.7 eV with ease by changing the ratio of silicon material gas to germanium material gas at the time of film formation.

As another method for improving photoelectric conversion efficiency of photovoltaic devices, U.S. Pat. No. 2,949, 498 discloses the use of what is called a stacked cell in which photovoltaic devices having unit device structure are superposed in plurality. This stacked cell makes use of p-n junction crystal semiconductors. Its concept is common to both amorphous and crystalline and is suited to make sunlight spectra absorb more efficiently through photovoltaic devices having different band gaps and make Voc (open-circuit voltage) higher so that electricity generation efficiency can be improved.

In the stacked cell, constituent devices having different band gaps are superposed in plurality, and sunlight rays are absorbed efficiently at every part of their spectra so that photoelectric conversion efficiency can be improved. The cell is so designed that what is called the bottom layer, positioned beneath what is called the top layer, has a narrower band gap than the band gap of the top layer, positioned on the light incident side of the constituent devices superposed.

This has enabled sufficient absorption of sunlight spectra to bring about a dramatic improvement in photoelectric conversion efficiency (K. Miyachi et al., Proc. 11th E.C. Photovoltaic Solar Energy Conf., Montrieux, Switzerland, 88, 1992; and K. Nomoto et al., "a-Si Alloy Three Stacked Solar Cells with High Stabilized Efficiency", 7th Photovoltaic Science and Engineering Conf., Nagoya, 275, 1993).

Now, the above photovoltaic device is a device making use of amorphous semiconductors in all i-type layers, and hence it has had a limit to the prevention of what is called deterioration by light, a phenomenon in which photoelectric conversion efficiency becomes low because of irradiation by light. This is caused by amorphous silicon and amorphous silicon germanium whose film quality has decreased due to deterioration by light and poor carrier movability. This is a phenomenon peculiar to amorphous semiconductors which is not seen in crystal types. Accordingly, under existing circumstances, such a device has a poor reliability and hinders itself from being put into practical use, when used for electric power purposes.

In recent years, research has also been made not only on amorphous/amorphous types but also amorphous/crystalline types, and an improvement in photoelectric conversion efficiency is reported (Hamakawa, Y. et al., "Device Physics and Optimum Design of a-Si/Poly-Si Tandem Solar Cells", Proceedings of 4th International PVSEC, pp.403–408, February 1989; (A. Shah, H. Keppner et al., "Intrinsic Microcrystalline Silicon ($\mu$c-Si:H)—A Promising New Thin-Film Solar Cell Material", IEEE First World Conference on Photovoltaic Energy Conversion, pp.409–412, December 1994; Mitchel, R. L. et al., "The DOE/SERI Polycrystalline Thin-film Subcontract Program," Processings of 20th IEEE Photovoltaic Specialists Conference, pp.1469–1476, September 1988).

However, taking account of the balance of electric currents of electricity generated by light in the stacked cell, the cell on the light incident side (the side having a broad band gap) must be formed in a large layer thickness. This has not been satisfactory from the viewpoint of deterioration by light.

Accordingly, it is desired to make amorphous photovoltaic devices undergo much less deterioration by light and to improve their photoelectric conversion efficiency after deterioration by light. In addition, in order to use them for electric power purpose, it is sought to more improve photoelectric conversion efficiency.

SUMMARY OF THE INVENTION

An object of the present invention is to provide a stacked photovoltaic device which is practical and low-cost and yet has high reliability and high photoelectric conversion efficiency.

To achieve the above object, the present invention provides a stacked photovoltaic device comprising at least three p-i-n junction constituent devices superposed in layers, each having a p-type layer, an i-type layer and an n-type layer which are formed of silicon non-single crystal semiconductors, wherein an amorphous silicon layer is used as the i-type layer of a first p-i-n junction, a microcrystalline silicon layer is used as the i-type layer of a second p-i-n junction and a microcrystalline silicon layer is used as the i-type layer of a third p-i-n junction; the first to third p-i-n junction layers being in order from the light-incident side. (The "p-i-n junction" is herein meant to be a layer having p-i-n junction, i.e., a layer having regions of transition between p-type, i-type and n-type layers.)

The microcrystalline silicon layer which is the i-type layer of the second p-i-n junction may preferably have a layer thickness in the range of from 0.5 $\mu$m to 1.5 $\mu$m.

Meanwhile, the microcrystalline silicon layer which is the i-type layer of the third p-i-n junction may preferably have a layer thickness in the range of from 1.5 $\mu$m to 3.5 $\mu$m.

The microcrystalline silicon layer which is the i-type layer of the second p-i-n junction may preferably contain boron, and the boron may preferably be in a content not more than 8 ppm.

Meanwhile, the microcrystalline silicon layer which is the i-type layer of the third p-i-n junction may preferably contain boron, and the boron may preferably be in a content not more than 8 ppm.

The n-type layer of the second p-i-n junction may also preferably comprise a microcrystalline silicon layer or a double layer consisting of a microcrystalline silicon layer and an amorphous silicon layer.

Meanwhile, the n-type layer of the third p-i-n junction may also preferably comprise a microcrystalline silicon layer or a double layer consisting of a microcrystalline silicon layer and an amorphous silicon layer.

The microcrystalline silicon layers which are the i-type layers of the second and the third p-i-n junctions may preferably each have an optical absorption coefficient of 200 $cm^{-1}$ or above at 950 nm.

The microcrystalline silicon layer which is the i-type layer of the second p-i-n junction may preferably be formed by plasma CVD (chemical vapor deposition) using a high frequency power of from 0.1 GHz to 10 GHz.

Meanwhile, the microcrystalline silicon layer which is the i-type layer of the third p-i-n junction may also preferably be formed by plasma CVD using a high frequency power of from 0.1 GHz to 10 GHz.

The stacked photovoltaic device of the present invention may preferably be formed by a roll-to-roll system in which the layers are superposed while transporting a continuous substrate stretched over a pair of rolls.

DESCRIPTION OF THE PREFERRED EMBODIMENTS

Figure 1:
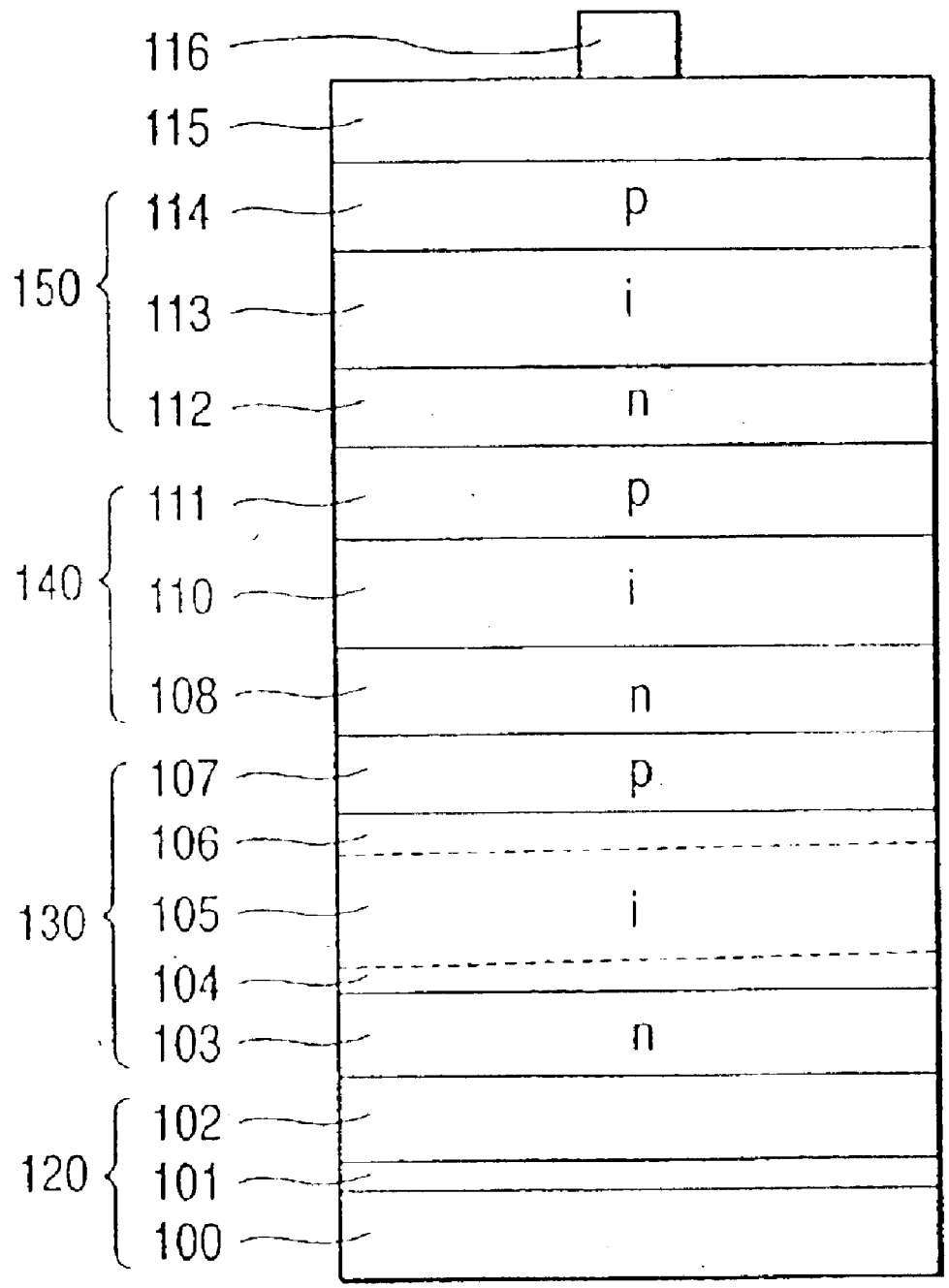
FIG. 1 is a schematic view for illustrating diagrammatically a cross-sectional structure of an example of the stacked photovoltaic device according to the present invention.

As stated previously, the present invention relates to a novel stacked photovoltaic device. The present invention will be described below in detail with respect to its constitution and operation.

As a result of extensive studies on a stacked photovoltaic device that can solve the problems discussed above, may cause less deterioration by light and also has a high photoelectric conversion efficiency, the present inventors have reached the following findings.

In order to make the rate of deterioration by light lower and improve photoelectric conversion efficiency after deterioration by light, while maintaining a high photoelectric conversion efficiency, among stacked photovoltaic devices, a stacked photovoltaic device is suited in which an amorphous silicon layer is used as the i-type layer of the first p-i-n junction, a microcrystalline silicon layer is used as the i-type layer of the second p-i-n junction and a microcrystalline silicon layer is used as the i-type layer of the third p-i-n junction, the first to third p-i-n junction layers being in order from the light incident side, i.e., an a-Si/μc-Si/μc-Si triple-type photovoltaic device.

The use of a microcrystalline silicon layer as the i-type layer of the second p-i-n junction and a microcrystalline silicon layer as the i-type layer of the third p-i-n junction brings about an improvement in semiconductor layers which have hitherto undergone a great deterioration by light in amorphous silicon type stacked photovoltaic devices and makes it possible to further restrain the deterioration by light, as compared to any conventional stacked photovoltaic devices.

The use of a microcrystalline silicon layer as the i-type layer of the third p-i-n junction also makes it possible to absorb long wavelength light which has hitherto been relatively difficult to absorb, to achieve higher short circuit current than any conventional stacked photovoltaic devices, and also to maintain a high photoelectric conversion efficiency.

With regard to the layer thickness of the microcrystalline silicon layer which is the i-type layer of the second p-i-n junction and/or the layer thickness of the microcrystalline silicon layer which is the i-type layer of the third p-i-n junction, making it/them smaller beyond the layer thickness having hitherto been considered suitable makes it possible to restrain localized levels in the i-type layer from increasing as a result of irradiation by light, to further restrain the deterioration by light, as compared to any conventional stacked photovoltaic devices, and to improve photoelectric conversion efficiency after deterioration by light.

Incorporation of boron in the microcrystalline silicon layer which is the i-type layer of the second p-i-n junction and setting its content to be not more than 8 ppm and/or incorporation of boron in the microcrystalline silicon layer which is the i-type layer of the third p-i-n junction and setting its content to be not more than 8 ppm make(s) it possible not to inhibit the growth of microcrystals and to improve the movability of holes at the time of electricity generation by light to thereby further restrain the deterioration by light, as compared to any conventional stacked photovoltaic devices, and maintain a high photoelectric conversion efficiency.

Formation of the n-type layer of the second p-i-n junction by a microcrystalline silicon layer or by a double layer consisting of a microcrystalline silicon layer and an amorphous silicon layer and/or formation of the n-type layer of the third p-i-n junction by a microcrystalline silicon layer or by a double layer consisting of a microcrystalline silicon layer and an amorphous silicon layer make(s) it possible to form at a high deposition rate the microcrystalline silicon of the i-type layer formed on the n-type layer, to form good quality microcrystalline silicon having fewer impurities and to maintain a high photoelectric conversion efficiency with less deterioration by light.

Making the microcrystalline silicon layers which are the i-type layers of the second and third p-i-n junctions each have an optical absorption coefficient of 200 $cm^{-1}$ or above at 950 nm makes it possible to form the microcrystalline silicon layers which are the i-type layers of the second and third p-i-n junctions, in a layer thickness smaller than the layer thickness having hitherto been considered suitable, to restrain localized levels in the i-type layer from increasing as a result of irradiation by light, and to further restrain the deterioration by light, as compared to any conventional stacked photovoltaic devices. This also makes it possible to absorb long wavelength light which has hitherto been relatively difficult to absorb and to achieve higher photoelectric conversion efficiency than any conventional stacked photovoltaic devices.

With regard to the microcrystalline silicon layers which are the i-type layers of the second and third p-i-n junctions, their formation by plasma CVD using a high frequency power (microwaves or VHF waves) of from 0.1 GHz to 10 GHz, which enables discharging even at a high degree of vacuum, especially by controlling plasma conditions at the deposition initial stage, makes it possible to decompose and activate in a good efficiency material gases diluted with hydrogen in a large quantity, to restrain localized levels even at a high deposition rate to obtain good quality microcrystalline silicon having a low defect density, and to further improve photoelectric conversion efficiency after deterioration by light of the triple-type photovoltaic device.

Formation of the stacked photovoltaic device of the present invention by a roll-to-roll system makes it possible to improve productivity very much.

The above stacked photovoltaic device of the present invention makes it possible to restrain deterioration by light, to make deterioration by light occur less while maintaining a high photoelectric conversion efficiency and to improve the photoelectric conversion efficiency after deterioration by light.

Preferred embodiments of the stacked photovoltaic device according to the present invention will be described below. The present invention is by no means limited to these embodiments.

In order to further improve photoelectric conversion efficiency of non-single crystal silicon photovoltaic devices, to prevent deterioration by light and to improve reliability of non-single-crystal silicon photovoltaic devices, the present inventors have made the following studies.

First, as well known, in order to make deterioration by light occur less, it is effective to make the photovoltaic device in a stacked form. However, this does not sufficiently address deterioration by light. As a result of studies having been conducted on the constitution of the stacked photovoltaic device, the present inventors have reached the following findings.

One finding is that, among stacked photovoltaic devices, the deterioration by light can be made to occur less in triple-type photovoltaic devices in which three p-i-n junctions are superposed than in double-type photovoltaic devices in which two p-i-n junctions are superposed. This is presumably because, when semiconductor materials of the like types are used, the electric current generated by light is produced less for each p-i-n junction in the triple-type than in the double-type, so that the recombination of holes and electrons which causes deterioration by light of amorphous semiconductors may occur less.

Another finding is that, among triple-type photovoltaic devices, to reduce deterioration by light, the stacked photovoltaic device is most suited in which an amorphous silicon layer is used as the i-type layer of the first p-i-n junction, a microcrystalline silicon layer is used as the i-type layer of the second p-i-n junction and a microcrystalline silicon layer is used as the i-type layer of the third p-i-n junction, the first to third p-i-n junction layers being in the order from the light-incident side, i.e., the a-Si/μc-Si/μc-Si triple-type photovoltaic device. This is because the microcrystalline silicon layers each having an optical absorption coefficient of 200 $cm^{-1}$ or above at 950 nm are used as the i-type layers of the second and third p-i-n junctions, which makes the deterioration by light occur much less than in conventional non-single crystal silicon triple-type photovoltaic devices.

Accordingly, the present inventors have conducted further studies on a-Si/μc-Si/μc-Si triple-type photovoltaic devices. As the result, it has proved to be preferable that, in order to make an a-Si/μc-Si/μc-Si triple-type photovoltaic device have the highest photoelectric conversion efficiency, the amorphous silicon layer which is the i-type layer of the first p-i-n junction may have a band gap of from 1.60 eV to 1.90 eV, the microcrystalline silicon layer which is the i-type layer of the second p-i-n junction may be formed in a layer thickness of from 0.5 μm to 1.5 μm and the microcrystalline silicon layer which is the i-type layer of the third p-i-n junction may be formed in a layer thickness of from 1.5 μm to 3.5 μm.

Here, it has been found that the amorphous silicon layer which is the i-type layer of the first p-i-n junction may have a layer thickness of from 500 to 2,500 angstroms, and more preferably from 700 to 1,500 angstroms. (Hereinafter, the first p-i-n junction is called "top cell", the second p-i-n junction "middle cell", and the third p-i-n junction "bottom cell").

The present inventors have conducted still further studies. Taking account of both the photoelectric conversion efficiency and the deterioration by light of the a-Si/μc-Si/μc-Si triple-type photovoltaic device, they have studied how the rate of deterioration by light can be made lower while maintaining a high photoelectric conversion efficiency, i.e., how the photoelectric conversion efficiency after the lowering of photoelectric conversion efficiency due to deterioration by light has saturated (hereinafter simply "stabilized conversion efficiency") can be maximized, in other words, the best mode of the present invention.

Stacked photovoltaic devices are constituted of a plurality of p-i-n junctions connected in series. Hence, the values of electric current caused in the respective p-i-n junctions may be made as large as possible and also their respective values of electric current may be made close to one another, whereby a higher photoelectric conversion efficiency can be achieved.

For example, if the microcrystalline silicon layer which is the i-type layer of the middle cell of the a-Si/μc-Si/μc-Si triple-type photovoltaic device is formed in a layer thickness smaller than 0.5 μm, the electric current may be caused less by light, tending to cause a decrease in photoelectric conversion efficiency as a triple cell. If, on the other hand, it is formed in a layer thickness larger than 1.5 μm, the middle cell can cause electric current sufficiently, but the light may enter the bottom cell in a small quantity, resulting in a small quantity of electric current caused in the bottom cell tending to cause a decrease in photoelectric conversion efficiency as a triple cell.

If the microcrystalline silicon layer which is the i-type layer of the bottom cell is formed in a layer thickness smaller than 1.5 μm, the electric current may be caused less by light to tend to cause a decrease in photoelectric conversion efficiency as a triple cell. If, on the other hand, it is formed in a layer thickness larger than 3.5 μm, it may affect the carrier movability adversely at the time of electricity generation by light, resulting in a lowering of FF (fill factor) of the bottom cell tending to cause a decrease in photoelectric conversion efficiency as a triple cell.

Repetition of such studies has revealed that the microcrystalline silicon layer as the i-type layer of the middle cell may preferably be formed in a thickness of from 0.5 μm to 1.5 μm, and more preferably from 0.6 μm to 1.2 μm It has also revealed that the microcrystalline silicon layer as the i-type layer of the bottom cell may preferably be formed in a thickness of from 1.5 μm to 3.5 μm, and more preferably from 1.7 μm to 3.3 μm.

Incorporation of boron in an amount not more than 8 ppm in the microcrystalline silicon layer which is the i-type layer of the middle cell also makes it possible to improve the movability of holes at the time of electricity generation by light without inhibiting the growth of microcrystals of the microcrystalline silicon and while controlling any lowering of film quality which may be caused by excessive inert boron. This has made it possible to maintain a high photoelectric conversion efficiency while controlling the deterioration by light.

In addition, similarly, the incorporation of boron in an amount not more than 8 ppm in the microcrystalline silicon layer which is the i-type layer of the bottom cell makes it possible to improve the movability of holes at the time of electricity generation by light without inhibiting the growth of microcrystals of the microcrystalline silicon and while controlling any lowering of film quality which may be caused by excessive inert boron. This has made it possible to maintain a high photoelectric conversion efficiency while controlling the deterioration by light.

Formation of the n-type layer of the middle cell by a microcrystalline silicon layer or by a double layer consisting of a microcrystalline silicon layer and an amorphous silicon layer makes it possible to form at a high deposition rate the microcrystalline silicon of the i-type layer formed on the n-type layer, to form good quality microcrystalline silicon while restraining impurities from mixing as far as possible. Also, the microcrystalline silicon of the i-type layer formed on the n-type layer is formed as a good quality microcrystalline silicon having less amorphous silicon component from the beginning of deposition, and also the n-type semiconductor layer is formed by a microcrystalline silicon layer or by a double layer consisting of a microcrystalline silicon layer and an amorphous silicon layer. This makes it possible to deposit the microcrystalline silicon of the i-type layer at a temperature relatively higher than the deposition substrate temperature that has hitherto been studied, so that microcrystalline silicon with a better film quality can be formed. In addition, the formation of the n-type layer by a microcrystalline silicon layer or by a double layer consisting of a microcrystalline silicon layer and an amorphous silicon layer makes it possible to cause less damage to the n-type layer which may be caused by hydrogen ions included at the initial stage of deposition of microcrystalline silicon of the i-type layer. This has made it possible to make the deterioration by light occur less and to maintain a high photoelectric conversion.

Formation of the n-type layer of the bottom cell by a microcrystalline silicon layer or by a double layer consisting of a microcrystalline silicon layer and an amorphous silicon layer also makes it possible to form at a high deposition rate the microcrystalline silicon of the i-type layer formed on the n-type layer, to form good quality microcrystalline silicon while restraining impurities from mixing as far as possible. Also, the microcrystalline silicon of the i-type layer formed on the n-type layer is formed as a good quality microcrystalline silicon having less amorphous silicon component from the beginning of deposition, and also the n-type layer is formed by a microcrystalline silicon layer or by a double layer consisting of a microcrystalline silicon layer and an amorphous silicon layer. This makes it possible to deposit the microcrystalline silicon of the i-type layer at a temperature relatively higher than the deposition substrate temperature that has hitherto been studied, so that microcrystalline silicon with a better film quality can be formed. In addition, the formation of the n-type layer by a microcrystalline silicon layer or by a double layer consisting of a microcrystalline silicon layer and an amorphous silicon layer makes it possible to cause less damage to an n-type layer which may be caused by hydrogen ions included at the initial stage of deposition of microcrystalline silicon of the i-type layer. This has made it possible to make the deterioration by light occur less and to maintain a high photoelectric conversion.

It has also been found that, even when the microcrystalline silicon layer which is the i-type layer of the bottom cell is formed in the layer thickness smaller than and up to the above value, the value of electric current caused in the bottom cell can be maintained by making the microcrystalline silicon have a large optical absorption coefficient.

It has still also been found that, even when the microcrystalline silicon layer which is the i-type layer of the bottom cell is formed in the layer thickness smaller than and up to the above value, the value of electric current caused in the bottom cell can be maintained by making the microcrystalline silicon have an optical absorption coefficient of 200 $cm^{-1}$ or above at 950 nm.

Stated specifically, it has been found that the value of electric current caused in the bottom cell can be maintained by forming the bottom cell i-type layer microcrystalline silicon layer at a higher deposition substrate temperature or by changing the rate of dilution with hydrogen.

Use of the microcrystalline silicon in the i-type layers of the middle and bottom cells has made it possible to make open-circuit voltage (Voc) relatively high, which has hitherto been questioned as being low, and to maintain a high photoelectric conversion efficiency.

An amorphous silicon layer or amorphous silicon carbide layer provided between the p-type layer and the microcrystalline silicon layer in each of the middle cell and bottom cell has the function chiefly to improve open-circuit voltage (Voc) of the photovoltaic device. This is presumably because the amorphous silicon layer or amorphous silicon carbide layer makes large the diffusion potential of the p-i-n junction. It can also be presumed that such a layer forms a barrier which prevents the electrons produced by light in the microcrystalline silicon from diffusing into the p-type layer.

The amorphous silicon layer or amorphous silicon carbide layer may preferably be formed in a layer thickness of from 30 angstroms to 450 angstroms, and more preferably from 50 angstroms to 350 angstroms. The amorphous silicon layer or amorphous silicon carbide layer provided in such a measure of layer thickness has minimally caused an increase in the rate of deterioration by light of the photovoltaic device.

As a result of further extensive studies made by the present inventors, the formation of microcrystalline silicon by plasma CVD using a high frequency power of from 0.1 GHz to 10 GHz and also by optimizing formation conditions has made it possible to obtain good quality microcrystalline silicon having a small defect density. As the result, it has become possible to improve photoelectric conversion efficiency of the photovoltaic device in which the microcrystalline silicon is used in the i-type layer and also to make its deterioration by light occur less, i.e., to improve the stabilized conversion efficiency.

This has been achieved by the formation of microcrystalline silicon by plasma CVD using a high frequency power of from 0.1 GHz to 10 GHz (VHF plasma CVD or microwave plasma CVD) and also by optimizing formation conditions, whereas the microcrystalline silicon is formed by RF plasma CVD in almost all conventional devices. It is considered that the use of such a high frequency power makes material gas decomposition efficiency high, makes decomposition efficiency high especially when material gases are fed in a large quantity in order to enhance deposition rate, and makes hydrogen decompose at a high rate under large quantity dilution with hydrogen so as to be activated with ease, so that the mobility of precursors at the growth surface of a thin film being deposited has become greater to have enabled the formation of good quality microcrystalline silicon.

It is also considered that, when the microcrystalline silicon is formed by the plasma CVD using a high frequency power of from 0.1 GHz to 10 GHz, films can be formed at a higher rate and therefore at a higher substrate temperature than when RF plasma CVD is used to have enabled the formation of good quality microcrystalline silicon.

Use of relatively high temperature deposited good quality microcrystalline silicon in the i-type layer of the bottom cell, formed by the plasma CVD using a high frequency power of from 0.1 GHz to 10 GHz, has made it possible to keep any thermal damage to a minimum in the course of the middle cell being formed and to cause less deterioration by light while maintaining a high photoelectric conversion efficiency as a triple cell, i.e., to improve the stabilized conversion efficiency.

Combination of what is called the roll-to-roll system with the above plasma CVD using a high frequency power of from 0.1 GHz to 10 GHz, the former being a system in which thin films are formed on the surface of a substrate while transporting a belt-like substrate continuously, also has made it possible to reduce the localized levels in the vicinity of interfaces between a plurality of semiconductor layers to thereby improve photoelectric conversion efficiency of the photovoltaic device.

FIG. 1 illustrates diagrammatically a cross-sectional structure of an example of the stacked photovoltaic device according to the present invention. The stacked photovoltaic device shown in FIG. 1 has a structure wherein three p-i-n junctions are superposed on a substrate 120. Reference numeral 150 denotes a first p-i-n junction (top cell); 140, a second p-i-n junction (middle cell); and 130, a third p-i-n junction (bottom cell); which are in order from the light incident side.

These three p-i-n junctions are superposed on a substrate 120 comprising a base member 100 and formed thereon a metal layer 101 and a transparent conductive layer 102, and a transparent electrode 115 and a collector electrode 116 are formed at the uppermost part of the three p-i-n junctions to form the stacked photovoltaic device.

These p-i-n junctions are comprised respectively of an n-type layer 112, n-type microcrystalline semiconductor layers 103 and 108, an i-type layer 113, i-type microcrystalline semiconductor layers 105 and 110, i-type buffer layers 104 and 106, and p-type layers 107, 111 and 114.

In this photovoltaic device, amorphous silicon is used as the i-type layer 113 of the first p-i-n junction, microcrystalline silicon is used as the i-type layer 110 of the second p-i-n junction and microcrystalline silicon is used as the i-type layer 105 of the third p-i-n junction.

Figure 2:
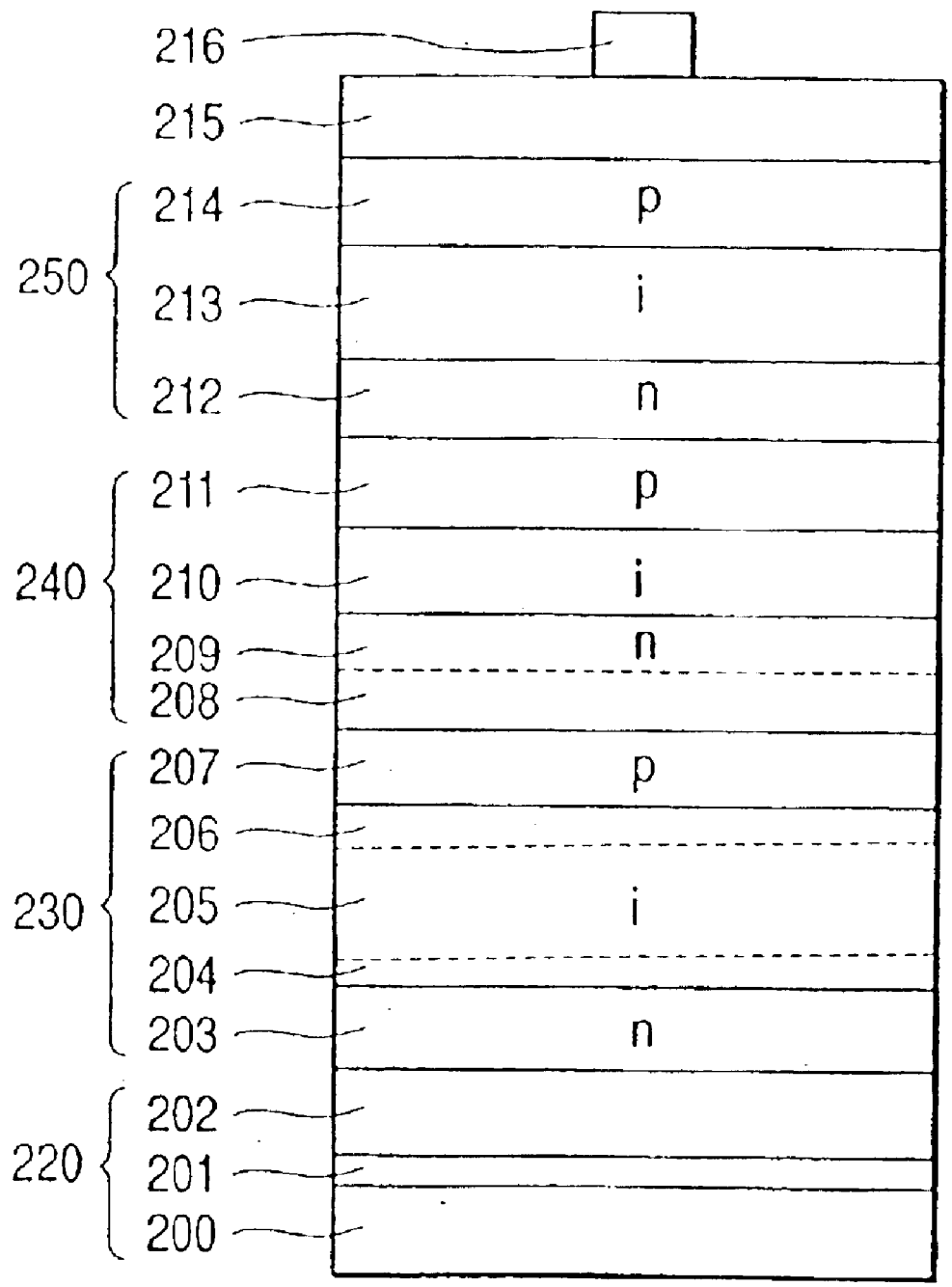
FIG. 2 is a schematic view for illustrating diagrammatically a cross-sectional structure of another example of the stacked photovoltaic device according to the present invention.

FIG. 2 illustrates diagrammatically a cross-sectional structure of another example of the stacked photovoltaic device according to the present invention. The stacked photovoltaic device shown in FIG. 2 has a structure wherein three p-i-n junctions are superposed on a substrate 220. Reference numeral 250 denotes a first p-i-n junction (top cell); 240, a second p-i-n junction (middle cell); and 230, a third p-i-n junction (bottom cell); which are in order from the light incident side.

These three p-i-n junctions are superposed on a substrate 220 comprising a base member 200 and formed thereon a metal layer 201 and a transparent conductive layer 202, and transparent electrode 215 and a collector electrode 216 are formed at the uppermost part of the three p-i-n junctions to form the stacked photovoltaic device.

These p-i-n junctions are comprised respectively of n-type layers 208 and 212, n-type microcrystalline semiconductor layers 203 and 209, an i-type layer 213, i-type microcrystalline semiconductor layers 205 and 210, i-type buffer layers 204 and 206, and p-type layers 207, 211 and 214.

In this photovoltaic device, too, amorphous silicon is used as the i-type layer 213 of the first p-i-n junction, microcrystalline silicon is used as the i-type layer 210 of the second p-i-n junction and microcrystalline silicon is used as the i-type layer 205 of the third p-i-n junction.

Figure 3:
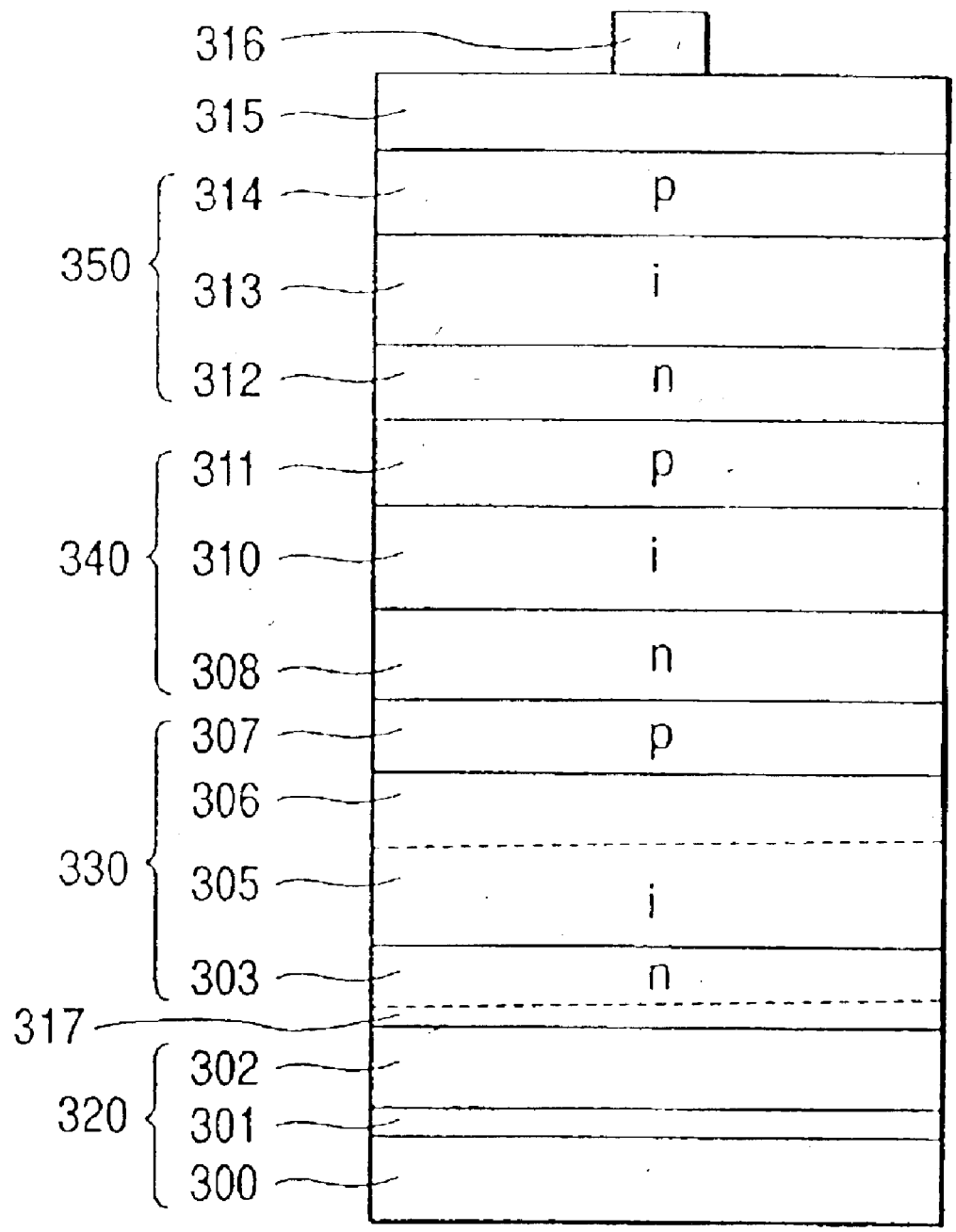
FIG. 3 is a schematic view for illustrating diagrammatically a cross-sectional structure of still another example of the stacked photovoltaic device according to the present invention.

FIG. 3 illustrates diagrammatically a cross-sectional structure of still another example of the stacked photovoltaic device according to the present invention. The stacked photovoltaic device shown in FIG. 3 has a structure wherein three p-i-n junctions are superposed on a substrate 320. Reference numeral 350 denotes a first p-i-n junction (top cell); 340, a second p-i-n junction (middle cell); and 330, a third p-i-n junction (bottom cell); which are in order from the light incident side.

These three p-i-n junctions are superposed on a substrate 320 comprising a base member 300 and formed thereon a metal layer 301 and a transparent conductive layer 302, and a transparent electrode 315 and a collector electrode 316 are formed at the uppermost part of the three p-i-n junctions to form the stacked photovoltaic device.

These p-i-n junctions are comprised respectively of n-type layers 317 and 312, n-type microcrystalline semiconductor layers 303 and 308, an i-type layer 313, i-type microcrystalline semiconductor layers 305 and 310, an i-type buffer layer 306, and p-type layers 307, 311 and 314.

In this photovoltaic device, too, amorphous silicon is used as the i-type layer 313 of the first p-i-n junction, microcrystalline silicon is used as the i-type layer 310 of the second p-i-n junction and microcrystalline silicon is used as the i-type layer 305 of the third p-i-n junction.

The stacked photovoltaic devices shown in FIGS. 1 to 3 may also have layer configurations wherein the n-type semiconductor layers (inclusive of n-type microcrystalline semiconductor layers) and p-type semiconductor layers in the p-i-n junctions are replaced with one another.

The constituents of the stacked photovoltaic device of the present invention will be further detailed below with reference to FIG. 1.

Substrate

Since the semiconductor layers 103 to 114 are thin films of about 3 $\mu$m at most in total thickness, they are deposited on a suitable substrate. The base member 100 used in such a substrate may be either single-crystal or non-single crystal and also may be either electrically conductive or electrically insulating. The base member 100 may further be either light-transmitting or non-light-transmitting, but may preferably be free from deformation or strain and have a desired strength.

It may specifically include thin sheets of metals such as Fe, Ni, Cr, Al, Mo, Au, Nb, Ta, V, Ti, Pt and Pb and alloys thereof as exemplified by bronze and stainless steel, and composites of these; films or sheets of heat-resistant synthetic resins such as polyester, polyethylene, polycarbonate, cellulose acetate, polypropylene, polyvinyl chloride, polyvinylidene chloride, polystyrene, polyamide, polyimide and epoxy, or composites of any of these with glass fiber, carbon fiber, boron fiber or metal fiber; any of these materials subjected to surface coating by sputtering, vapor deposition or plating to cover their surfaces with a metal thin film formed of a different kind of material and/or an insulating thin film formed of $SiO_2$, $Si_3N_4$, $Al_2O_3$, AlN; and glasses and ceramics.

In use as a substrate for the photovoltaic device, when the base member 100 is made of an electrically conductive material such as a metal, it may serve as an electrode for collecting electric currents directly. When it is made of an electrically insulating material such as a synthetic resin, its surface on the side where deposited films are formed may preferably previously be surface-treated by plating, vapor deposition or sputtering of a single metal, an alloy or a transparent conductive oxide (TCO), such as Al, Ag, Pt, Au, Ni, Ti, Mo, W, Fe, V, Cr. Cu, stainless steel, bronze, nichrome, $SnO_2$, $In_2O_3$, ZnO and ITO (indium-tin oxide) to form an electrode for collecting electric currents. Such an electrode may be formed as the metal layer 101 and/or the transparent conductive layer 102.

Of course, also when the base member 100 is made of the electrically conductive material such as a metal, a different kind of metal layer may be provided on the base member 100 on its side where the deposited films are formed, in order to, e.g., improve reflectance of long wavelength light on the surface of the substrate and prevent constituent elements from their mutual diffusion between the substrate material and the deposited films. When the base member 100 is relatively transparent and the photovoltaic device has a layer configuration wherein the light is made incident on the side of the base member 100, a light-transmissive conductive thin film such as the above transparent conductive oxide or metal thin film may preferably previously be formed by deposition.

With regard to the surface properties of the base member 100, it may have a smooth surface or may have a finely uneven surface. When the substrate has a finely uneven surface, it may have spherical, conical or pyramidal unevenness with its maximum height (Rmax) of preferably from 0.05 $\mu$m to 2 $\mu$m. This makes the reflection of light from the surface irregular to bring about an increase in optical path length of the reflected light. The base member may have the shape of, e.g., a plate, continuous sheet, belt or cylinder having a smooth surface or uneven surface depending on purposes. Its thickness may be so determined appropriately that the photovoltaic device as desired can be formed. It may have a thickness as small as possible so long as the function as the base member can be exhibited well, when the photovoltaic device is required to have a flexibility or when light is made incident on the side of the base member. However, taking account of the production and handling of the base member and in view of its mechanical strength, it may usually have a thickness of at least 10 $\mu$m.

Metal Layer, Transparent Conductive Layer

The metal layer 101 used in the present invention is commonly an electrode (back surface electrode) provided on the back surface of the semiconductor layers against the light incident direction. Hence, it is provided at the position 101 in FIG. 1 or, in the case where the base member 100 is light-transmissive and the light is made incident on the side of the substrate, it is provided at the position 115.

Materials for the metal layer 101 include metals such as gold, silver, copper, aluminum, nickel, iron, chromium, molybdenum, tungsten, titanium, cobalt, tantalum, niobium and zirconium, or alloys such as stainless steel. In particular, metals having a high reflectance, such as aluminum, copper, silver and gold are particularly preferred. When the metals having a high reflectance are used, the back surface electrode may be made to serve also as a light reflecting layer that reflects the light not absorbed completely in the semiconductor layers to return it to the semiconductor layers.

The metal layer 101 may have a flat shape and may more preferably have an uneven shape to cause the light to scatter. In the case of the metal layer having such light-scattering uneven shape, any long wavelength light having not absorbed completely in the semiconductor layers can be scattered to elongate optical paths in the semiconductor layers, so that the photovoltaic device can be improved in its sensitivity to long wavelength light to increase short circuit currents and can be improved in photoelectric conversion efficiency. As to the light-scattering uneven shape, the difference in height (Rmax) between hills and valleys of the unevenness may preferably be from 0.2 µm to 2.0 µm.

When, however, the base member 100 serves also as the back surface electrode, it is unnecessary in some cases to form the metal layer 101.

The metal layer 101 may be formed by vapor deposition, sputtering, plating or printing. When the metal layer 101 is formed to have the light-scattering uneven shape, the metal or alloy film thus formed may be dry-etched or wet-etched, or sand-blasted or heated, to form the unevenness. Alternatively, the above metal or alloy may be vapor deposited on the base member 100 while heating it to provide the light-scattering uneven shape.

A transparent conductive layer 102 formed of conductive zinc oxide or the like may also be provided between the metal layer 101 and the n-type microcrystalline semiconductor layer 103. The transparent conductive layer 102 has the effect of not only preventing the metal elements constituting the metal layer 101 from their diffusion into the n-type microcrystalline semiconductor layer, but also, when endowed with a little resistance, preventing short circuit from being caused by defects such as pinholes between the metal layer 101 and the transparent electrode 115 which are provided so as to hold the semiconductor layers between them, and also confining in the photovoltaic device the light made incident after multiple interference is caused by thin films.

i-Type layer: Intrinsic Semiconductor Layer

In photovoltaic devices making use of IV—IV group and III–V group alloy type amorphous semiconductor materials, the i-type layer used in the p-i-n junction is an important layer that responds to irradiation with light to cause and transport carriers.

A slightly p-type or slightly n-type layer may also be used as the i-type layer.

IV—IV group and III—V group alloy type amorphous semiconductor materials contain hydrogen atoms (H,D) or halogen atoms (X) and these have important action. The hydrogen atoms (H,D) or halogen atoms (X) contained in the i-type layer act to compensate unbonded arms (dangling bonds) in the i-type layer to improve the mobility and lifetime of carriers in the i-type layer. They also act to compensate interfacial energy levels of the interfaces between p-type layer and i-type layer and between n-type layer and i-type layer and improve the photovoltaic effect of photovoltaic, photoelectric currents and photo-responsivity of the photovoltaic device.

The hydrogen atoms and/or halogen atoms contained in the i-type layer may be in an amount of from 1 to 40 atom % as an optimum content. In particular, as a preferable form of distribution, the hydrogen atoms and/or halogen atoms may be distributed in a larger content on the side of the interfaces between p-type layer and i-type layer and between n-type layer and i-type layer. In the vicinity of the interfaces, the hydrogen atoms and/or halogen atoms may be contained in an amount 1.05 to 2 times their content in the bulk, as a preferable range. It is also preferable that the content of the hydrogen atoms and/or halogen atoms changes correspondingly to the content of silicon atoms.

In the photovoltaic device of the present invention, amorphous silicon is used as the semiconductor material constituting the i-type layer 113 of the first p-i-n junction 150. Microcrystalline silicon is used as the semiconductor material constituting the i-type layer 110 of the second p-i-n junction 140. Microcrystalline silicon is used as the semiconductor material constituting the i-type layer 105 of the third p-i-n junction 130.

The amorphous silicon and microcrystalline silicon are represented as a-Si:H, a-Si:F, a-Si:H:F, µc-Si:H, µc-Si:F or µc-Si:H:F in accordance with the element(s) that compensate(s) dangling bonds.

Stated more specifically, as a material for the i-type layer 113 of the first p-i-n junction 150 preferred in the stacked photovoltaic device of the present invention, it may include i-type amorphous silicon hydride (a-Si:H), having characteristics such as an optical band gap (Eg) of from 1.60 eV to 1.90 eV, a hydrogen atom content ($C_H$) of from 1.0% to 25.0%, a photoconductivity (σp) of $1.0 \times 10^{-5}$ S/cm or above under irradiation by a solar simulator of AM 1.5 and 100 mW/cm$^2$, a dark conductivity (σd) of $1.0 \times 10^{-9}$ S/cm or below, an Urbach energy of 55 meV or below as measured by the constant photocurrent method (CPM), and a localized level density of $10^{17}$/cm$^3$ or below. Such a material may preferably be used.

The microcrystalline silicon constituting the i-type layer 110 of the second p-i-n junction 140 of the photovoltaic device according to the present invention may preferably be in a layer thickness of from 0.5 µm to 1.5 µm. The microcrystalline silicon constituting the i-type layer of the second p-i-n junction may preferably contain boron in an amount not more than 8 ppm. Also, the microcrystalline silicon layer which is the i-type layer of the second p-i-n junction may preferably have an optical absorption coefficient of 200 cm$^{-1}$ or above at 950 nm. The microcrystalline silicon layer which is the i-type layer of the second p-i-n junction may also preferably be a layer formed by plasma CVD making use of a high frequency power of from 0.1 GHz to 10 GHz.

The microcrystalline silicon constituting the i-type layer 105 of the third p-i-n junction 130 of the photovoltaic device according to the present invention may preferably be in a layer thickness of from 1.5 µm to 3.5 µm. The microcrystalline silicon constituting the i-type layer of the third p-i-n junction may preferably contain boron in an amount not more than 8 ppm. Also, the microcrystalline silicon layer which is the i-type layer of the third p-i-n junction may preferably have an optical absorption coefficient of 200 cm$^{-1}$ or above at 950 nm. The microcrystalline silicon layer which is the i-type layer of the third p-i-n junction may also preferably be a layer formed by plasma CVD making use of a high frequency power of from 0.1 GHz to 10 GHz.

p-Type Layer or n-Type Layer

The p-type layer or n-type layer also is an important layer that influences the characteristics of the stacked photovoltaic device of the present invention.

Amorphous materials (herein simply "a-") and microcrystalline materials (herein simply "μc-") of the p-type layer or n-type layer may include, e.g., materials such as a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-SiHX, μc-SiC:HX, μc-SiGe:H, μc-SiO:H, μc-SiGeC:H, μc-SiN:H, μc-SiON:HX and μc-SiOCN:HX (X is a halogen atom) to which a p-type valence electron control agent (Group III atom of the periodic table, B, Al, Ga, In or Tl) or an n-type valence electron control agent (Group V atom of the periodic table, P, As, Sb or Bi) has been added in a high concentration. These materials may also be used as materials for the i-type layer described above, without addition of the valence electron control agent.

The polycrystalline materials (herein simply "poly-") may include materials such as poly-Si:H, poly-Si:HX, poly-SiC:H, poly-SiC:HX, poly-SiGe:H, poly-Si, poly-SiC and poly-SiGe to which a p-type valence electron control agent (Group III atom of the periodic table, B, Al, Ga, In or Tl) or an n-type valence electron control agent (Group V atom of the periodic table, P, As, Sb or Bi) has been added in a high concentration.

A crystalline semiconductor layer having less absorbance or an amorphous semiconductor layer having a broad band gap is suited especially for the p-type layer or n-type layer on the light incident side.

The addition of the Group III atom of the periodic table to the p-type layer and the addition of the Group V atom of the periodic table to the n-type layer may each be in an amount of from 0.1 to 50 atom % as an optimum amount.

The hydrogen atoms (H,D) or halogen atoms (X) contained in the p-type layers or n-type layers also act to compensate unbonded arms in the p-type layer or n-type layer to improve the doping efficiency of the p-type layer or n-type layer. The hydrogen atoms or halogen atoms may be added to the p-type layer or n-type layer in an amount of from 0.1 to 40 atom % as an optimum amount. Especially when the p-type layer or n-type layer is crystalline, the hydrogen atoms or halogen atoms may be added in an amount of from 0.1 to 8 atom % as an optimum amount.

As a preferable form of distribution, the hydrogen atoms and/or halogen atoms may be distributed in a larger content on the side of the interfaces between p-type layer and i-type layer and between n-type layer and i-type layer. In the vicinity of the interfaces, the hydrogen atoms and/or halogen atoms may be contained in an amount 1.05 to 2 times their content in the bulk, as a preferable range.

When in this way the content of the hydrogen atoms or halogen atoms is made larger in the vicinity of the interfaces between p-type layer and i-type layer and between n-type layer and i-type layer, any defect levels and mechanical strain in the vicinity of the interfaces can be reduced, and the photovoltaic effect and photoelectric currents of the stacked photovoltaic device of the present invention can be enhanced.

As electrical characteristics of the p-type layer or n-type layer of the photovoltaic device, the layer may preferably have an activation energy of 0.2 eV or below, and most preferably 0.1 eV or below. It may also preferably have a specific resistance of 100 Ω·cm or below, and most preferably 1 Ω·cm or below. The p-type layer or n-type layer may preferably have a layer thickness of from 1 nm to 50 nm, and most preferably from 3 nm to 10 nm.

Formation of Semiconductor Layers

The Group IV and Groups III–V alloy type amorphous semiconductor layers preferable as the semiconductor layers of the stacked photovoltaic device of the present invention may most preferably be formed by microwave plasma CVD or VHF (very high frequency) plasma CVD, and second preferably by RF (radio frequency) plasma CVD.

The microwave plasma CVD and VHF plasma CVD are processes in which material gases such as film-forming gases and dilute gases are fed into a deposition chamber (a vacuum chamber) that can be brought into a vacuum state, the internal pressure of the deposition chamber is kept constant while evacuating it by means of a vacuum pump, and microwaves or VHF waves generated by a microwave power source or a VHF power source are guided through a waveguide or a coaxial cable and introduced into the deposition chamber through a dielectric window (such as alumina ceramic window) or a conductor (a rod of Ni, W or stainless steel) electrically insulated from the deposition chamber, whereby plasma of the material gases is caused to take place to carry out decomposition, to thereby form desired deposited films on the substrate placed in the deposition chamber. Thus, deposited films applicable to photovoltaic devices can be formed under broad deposition conditions.

In the case where the semiconductor layers in the stacked photovoltaic device of the present invention are deposited by microwave plasma CVD or VHF plasma CVD, substrate temperature in the deposition chamber may preferably be set in the range of from 250 to 500° C.; internal pressure, from 0.5 to 250 mTorr; microwave power or VHF power, from 0.01 to 1 W/cm$^3$; and microwave frequency or VHF wave frequency, from 0.1 to 10 GHz.

In the case where they are deposited by RF plasma CVD, substrate temperature in the deposition chamber may preferably be set in the range of from 100 to 350° C.; internal pressure, from 0.1 to 10 Torr; RF power, from 0.01 to 5.0 W/cm$^3$; and deposition rate, from 0.1 to 15 A/sec.

As a deposited film forming method suited for the formation of the semiconductor layers in the stacked photovoltaic device of the present invention, a roll-to-roll system is available. In this deposited film forming method, a plurality of glow discharge regions are arranged along a path successively passing through them, and a belt-like substrate is transported continuously in the longitudinal direction while depositing and forming thereon semiconductor layers with necessary conductivity types in the respective glow discharge regions. Thus, photovoltaic devices having the desired semiconductor junctions can be formed continuously.

The material gases suited for depositing the Groups IV—IV and Groups III–V alloy type amorphous semiconductor layers preferable in the stacked photovoltaic device of the present invention may include gasifiable compounds containing silicon atoms, gasifiable compounds containing germanium atoms, gasifiable compounds containing carbon atoms, gasifiable compounds containing nitrogen atoms, gasifiable compounds containing oxygen atoms, and mixed gases of any of these compounds.

Stated specifically, as the gasifiable compounds containing silicon atoms, chain or cyclic silane compounds may be used, specifically including, e.g., gaseous or readily gasifiable compounds such as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$ and $Si_2Cl_3F_3$.

The gasifiable compounds containing germanium atoms may specifically include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$ and $Ge_2D_6$.

The gasifiable compounds containing carbon atoms may specifically include $CH_4$, $CD_4$, $C_nH_{2n+2}$ (n is an integer), $C_nH_{2n}$, (n is an integer), $C_2H_2$, $C_6H_6$, C and CO.

The nitrogen-containing compounds may include $N_2$, $NH_3$, $ND_3$, NO, $NO_2$ and $N_2O$.

The oxygen-containing compounds may include $O_2$, CO, $CO_2$, NO, $NO_2$, $N_2O$, $CH_3CH_2OH$ and $CH_3OH$.

Materials incorporated into the p-type layer or n-type layer in order to control valence electrons may include Group III atoms and Group V atoms of the periodic table.

Materials effectively used as starting materials for incorporating Group III atoms may specifically include, as those for incorporating boron atoms, boron hydrides such as $B_2H_6$, $B_4H_{10}$, $B_5H_9$, $B_5H_{11}$, $B_6H_{10}$, $B_6H_{12}$ and $B_6H_{14}$, and boron halides such as $BF_3$ and $BCl_3$. Besides, the materials may also include $AlCl_3$, $GaCl_3$, $InCl_3$ and $TlCl_3$. $B_2H_6$ and $BF_3$ are particularly suited.

Materials effectively used as starting materials for incorporating Group V atoms may specifically include, as those for incorporating phosphorus atoms, phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$ and $PI_3$. Besides, the materials may also include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$. $PH_3$ and $PF_3$ are particularly suited.

These gasifiable compounds may be fed into the deposition chamber after they are appropriately diluted with a gas such as $H_2$, He, Ne, Ar, Xe or Kr.

Especially when the layers having less optical absorbance or a broad band gap such as microcrystalline semiconductor layers and a-SiC:H layers are deposited, the material gases may preferably be diluted to ½ to 1/100 with hydrogen gas, followed by feeding of microwave power or RF power which may be a relatively high power.

Transparent Electrode

In the present invention, the transparent electrode 115 is a light-transmitting electrode provided on the light incident side and also serves as a reflection preventive film when controlled to have an optimum layer thickness. The transparent electrode 115 is required to have a high transmittance in a wavelength region where the semiconductor layers can absorb light and to have a low resistivity. It may preferably have a transmittance of 80% or above, and more preferably 85% or above, at 550 nm.

The transparent electrode may preferably have a resistivity of $5 \times 10^{-3}$ Ω·cm or below, and more preferably $1 \times 10^{-3}$ Ω·cm or below.

As materials for the transparent electrode, conductive oxides such as $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$ and $Na_xWO_3$ or a mixture of some of these are preferably used.

An element capable of changing conductivity (i.e., a dopant) may also be added to these compounds. As the element capable of changing conductivity (a dopant), Al, In, B, Ga, Si and F may preferably be used in the case where the transparent electrode 115 is formed of ZnO; Sn, F, Te, Ti, Sb and Pb, when formed of $In_2O_3$; and F, Sb, P, As, In, Tl, Te, W, Cl, Br and I, when formed of $SnO_2$.

As methods for forming the transparent electrode, vapor deposition, CVD, spraying, spin-on processing and dipping may preferably be used.

Collector Electrode

In the present invention, the collector electrode 116 is provided optionally on part of the transparent electrode 115 when the transparent electrode 115 cannot be made to have a sufficiently low resistivity and acts to lower the resistivity of the electrode and lower the series resistance of the photovoltaic device.

Materials for the collector electrode may include gold, silver, copper, aluminum, nickel, iron, chromium, molybdenum, tungsten, titanium, cobalt, tantalum, niobium and zirconium, alloys such as stainless steel, and conductive pastes making use of powdery metals. As the shape thereof, the electrode is formed in a comb so that the light incident on the semiconductor layers is not intercepted as far as possible.

In the whole area of the photovoltaic device, the collector electrode may preferably cover an area of not more than 15%, more preferably not more than 10%, and most preferably not more than 5%.

The pattern of the collector electrode may be formed using a mask and, as methods therefor, by vapor deposition, sputtering, plating or printing. A wire-like metal may also be stuck with a conductive paste.

When a photovoltaic apparatus having the desired output voltage and output current is manufactured using the stacked photovoltaic device of the present invention, a plurality of stacked photovoltaic devices of the present invention are connected in series or in parallel, protective films are formed on the top surface and the back surface, and electrodes for collecting outputs are attached. In the case where the stacked photovoltaic devices of the present invention are connected in series, diodes for preventing back currents are incorporated in some cases.

EXAMPLES

The present invention will be described below by giving preferred examples. The present invention is by no means limited to these examples.

Example 1

Figure 4:
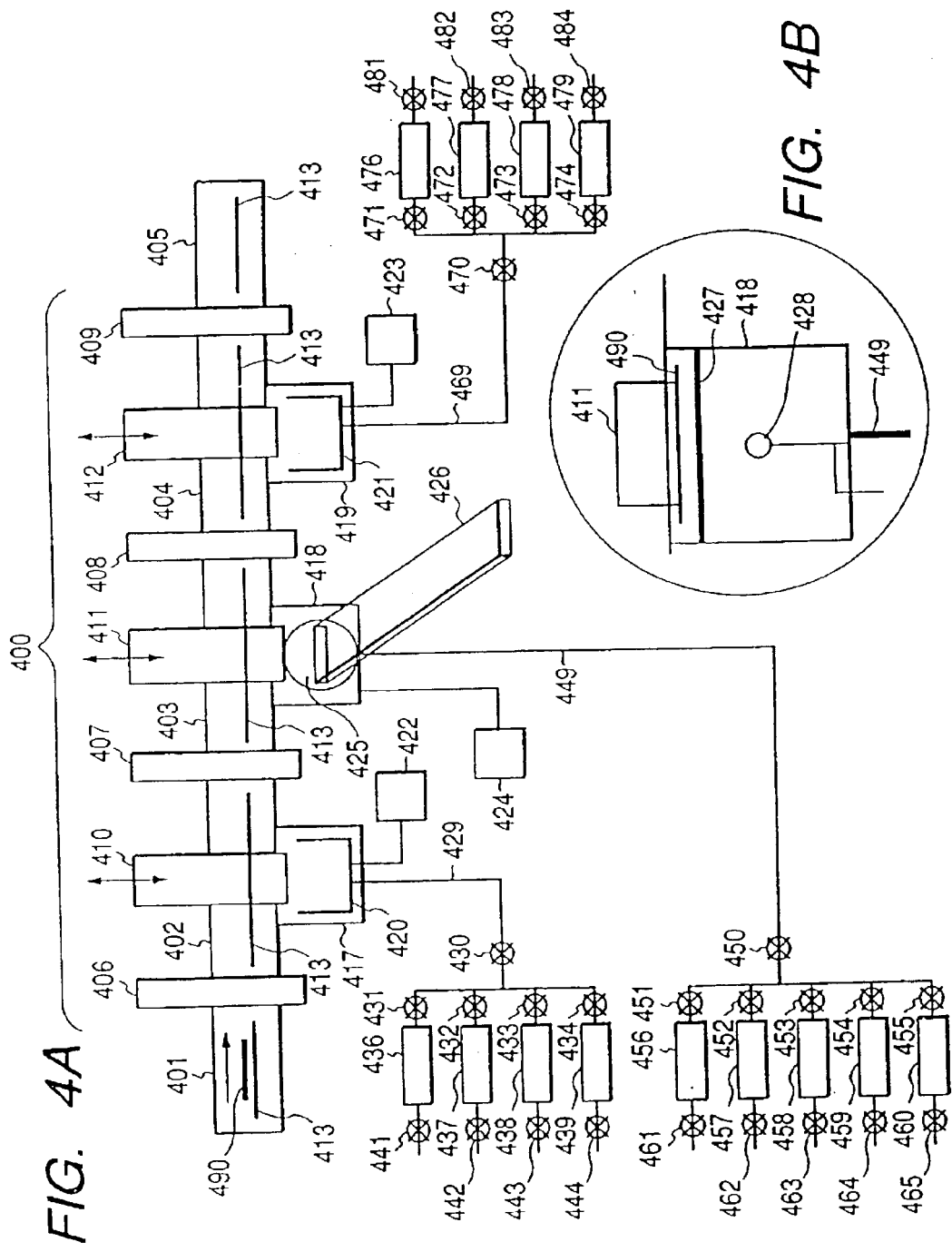
FIG. 4 is a diagrammatic view for illustrating an example of a production system suited for forming the stacked photovoltaic device of the present invention continuously.

The stacked photovoltaic device as shown in FIG. 1 was produced using a deposition system shown in FIG. 4. A deposition system 400 can carry out all of MWPCVD (microwave plasma CVD), VHFPCVD (VHF plasma CVD) and RFPCVD (radio frequency plasma CVD). Using this deposition system 400, the respective semiconductor layers were formed on a substrate 490 having light reflecting layers 101 and 102.

Material gas cylinders (not shown) are connected through gas feed pipes to the deposition system. The material gas cylinders contain all purified gases in an ultra-high purity, and an $SiH_4$ gas cylinder, a $CH_4$ gas cylinder, a $GeH_4$ gas cylinder, an $Si_2H_6$ gas cylinder, a $PH_3/H_2$ (dilution: 2.0%) gas cylinder, a $B_2H_6/H_2$ (dilution: 2.0%) gas cylinder, an $H_2$ gas cylinder, an He gas cylinder, an $SiCl_2H_2$ gas cylinder and an $SiH_4/H_2$ (dilution: 2%) gas cylinder were connected.

Next, the substrate 490, on which a metal layer 101 and a transparent conductive layer 102 had been formed, was placed on a substrate transporting rail 413 provided in a load chamber 401, and the inside of the load chamber 401 was evacuated by means of a vacuum exhaust pump (not shown) to have a pressure of about $1 \times 10^{-5}$ Torr.

Next, a gate valve 406 was opened to carry the substrate into a transport chamber 402 evacuated previously by means of a vacuum exhaust pump (not shown) and then into a deposition chamber 417. The substrate 490 was heated in such a manner that the back surface thereof was brought into close contact with a substrate heater 410. Then, the inside of the deposition chamber 417 was evacuated by means of a vacuum exhaust pump (not shown) to have a pressure of about $1 \times 10^{-5}$ Torr.

After it was completed to make film formation ready as described above, $H_2$ gas was fed into the deposition chamber 417 through a gas feed pipe 429. Then, valves 441, 431 and 430 were opened, and $H_2$ gas flow rate was controlled by means of a mass flow controller 436 so as to be 300 sccm. The pressure inside the deposition chamber 417 was controlled by means of a conductance valve (not shown) so as to be 1.0 Torr. The substrate heater 410 was set so as to bring the temperature of the substrate 490 to 350° C. At the time the substrate temperature became stable, a third p-i-n RF n-type layer 103 comprised of μc-Si was formed.

To form the third p-i-n RF n-type layer 103 comprised of μc-Si, valves 443, 433, 444 and 434 were operated to feed $SiH_4$ gas and $PH_3/H_2$ gas into the deposition chamber 417 through the gas feed pipe 429.

Here, $SiH_4$ gas flow rate, $H_2$ gas flow rate and $PH_3/H_2$ gas flow rate were controlled by means of mass flow controllers 438, 436 and 439 so as to be 0.4 sccm, 90 sccm and 0.5 sccm, respectively, and the pressure inside the deposition chamber 417 was controlled so as to be 1.0 Torr.

Power of the high frequency (hereinafter "RF") power source 422 was set to 0.55 W/cm³, and RF power was fed to a plasma forming cup 420 to cause glow discharge. Thus, the third p-i-n RF n-type layer was started being formed on the substrate, and a third p-i-n RF n-type layer with a layer thickness of 10 nm was formed, whereupon the RF power source was turned off to stop the glow discharge to complete the formation of the third p-i-n RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.

Next, a third p-i-n MW i-type layer 105 comprised of μc-Si and a third p-i-n RF i-type layer 106 comprised of a-Si were formed successively in the following way.

First, a gate valve 407 was opened to carry the substrate 490 (with the above layer formed thereon) into a transport chamber 403 and an i-type layer deposition chamber 418 which were evacuated previously by means of a vacuum exhaust pump (not shown). Incidentally, an enlarged view of the inside of the i-type layer deposition chamber 418 is shown in a circle in FIG. 4. The substrate 490 was heated in such a manner that the back surface thereof was brought into close contact with a substrate heater 411. Then, the inside of the i-type layer deposition chamber 418 was evacuated by means of a vacuum exhaust pump (not shown) to have a pressure of about $1\times10^{-5}$ Torr.

To form the third p-i-n MW i-type layer 105, the substrate heater 411 was set so as to bring the temperature of the substrate 490 to 300° C. At the time the substrate was heated, valves 461, 451, 450, 463 and 453 were opened slowly to flow $SiH_4$ gas and $H_2$ gas into the i-type layer deposition chamber 418 through a gas feed pipe 449.

Here, $SiH_4$ gas flow rate and $H_2$ gas flow rate were controlled by means of corresponding mass flow controllers 456 and 458 so as to be 80 sccm and 2,400 sccm, respectively. The pressure inside the i-type layer deposition chamber 418 was controlled so as to be 50 mTorr by adjusting the opening of a conductance valve (not shown). The power of an RF power source 424 was set to 0.22 W/cm³ and was applied to a bias rod 428.

Thereafter, the power of a microwave power source (2.45 GHz) (not shown) was set to 0.12 W/cm³, and the microwave power was fed into the i-type layer deposition chamber 418 through a waveguide 426 and a microwave introducing window 425 to cause glow discharge, and a shutter 427 was opened. Thus, the third p-i-n MW i-type layer started being formed on the third p-i-n RF n-type layer, and an i-type layer with a layer thickness of 3.0 μm was formed, whereupon the microwave glow discharge was stopped and the output from the bias power source 424 was stopped to complete the formation of the third p-i-n MW i-type layer 105.

The valves 451 and 453 were closed to stop the $SiH_4$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

To form the third p-i-n RF i-type layer 106, the substrate heater 411 was set so as to bring the temperature of the substrate 490 to 300° C. At the time the substrate was heated, valves 464, 454, 450, 463 and 453 were opened slowly to flow $Si_2H_6$ gas and $H_2$ gas into the i-type layer deposition chamber 418 through the gas feed pipe 449.

Here, $Si_2H_6$ gas flow rate and $H_2$ gas flow rate were controlled by means of corresponding mass flow controllers 459 and 458 so as to be 3.8 sccm and 100 sccm, respectively. The pressure inside the i-type layer deposition chamber 418 was controlled so as to be 0.8 Torr by adjusting the opening of a conductance valve (not shown).

Next, the power of the RF power source 424 was set to 0.0088 W/cm³ and was applied to the bias rod 428 to cause glow discharge, and the shutter 427 was opened. Thus, the third p-i-n RF i-type layer started being formed on the third p-i-n MW i-type layer, and an i-type layer with a layer thickness of 23 nm was formed, whereupon the RF glow discharge was stopped and the output from the RF power source 424 was stopped to complete the formation of the third p-i-n RF i-type layer 106.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

To form a third p-i-n RF p-type layer 107 comprised of SiC, a gate valve 408 was opened to carry the substrate 490 (with the above layers formed thereon) into a transport chamber 404 and a p-type layer deposition chamber 419 which were evacuated previously by means of a vacuum exhaust pump (not shown). The substrate 490 was heated in such a manner that the back surface thereof was brought into close contact with the substrate heater 412. Then, the inside of the p-type layer deposition chamber 419 was evacuated by means of the vacuum exhaust pump (not shown) to have a pressure of about $1\times10^{-5}$ Torr.

The substrate heater 412 was set so as to bring the temperature of the substrate 490 to 300° C. At the time the substrate temperature became stable, valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through a gas feed pipe 469.

Here, $H_2$ gas flow rate, $SiH_4/H_2$ gas flow rate, $B_2H_6/H_2$ gas flow rate and $CH_4$ gas flow rate were controlled by means of mass flow controllers 476, 477, 478 and 479 so as to be 75 sccm, 3 sccm, 9 sccm and 0.1 sccm, respectively, and the pressure inside the deposition chamber 419 was controlled so as to be 1.8 Torr by adjusting the opening of a conductance valve (not shown).

Next, the power of the RF power source 423 was set to 0.09 W/cm³, and RF power was fed to a plasma forming cup 421 to cause glow discharge. Thus, the third p-i-n RF p-type layer started being formed on the i-type layer, and an RF p-type layer with a layer thickness of 10 nm was formed, whereupon the RF power source was turned off to stop the glow discharge to complete the formation of the third p-i-n RF p-type layer 107.

The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1\times10^{-5}$ Torr.

To form a second p-i-n RF n-type layer 108 comprised of μc-Si, first the gate valve 408 was opened to carry the substrate 490 (with the above layers formed thereon) into the transport chamber 403 and i-type layer deposition chamber 418 evacuated previously by means of a vacuum exhaust pump (not shown), and the gate valve 407 was also opened to carry the substrate 490 into the transport chamber 402 and n-type layer deposition chamber 417 evacuated previously by means of a vacuum exhaust pump (not shown).

The substrate 490 was heated in such a manner that the back surface thereof was brought into close contact with the substrate heater 410. Then, the inside of the n-type layer deposition chamber 417 was evacuated by means of a vacuum exhaust pump (not shown) to have a pressure of about $1\times10^{-5}$ Torr. The substrate heater 410 was set so as to bring the temperature of the substrate 490 to 320° C. At the time the substrate temperature became stable, the valves 443, 433, 444 and 434 were operated to feed $SiH_4$ gas and $PH_3/H_2$ gas into the deposition chamber 417 through the gas feed pipe 429.

Here, $SiH_4$ gas flow rate, $H_2$ gas flow rate and $PH_3/H_2$ gas flow rate were controlled by means of the mass flow controllers 438, 436 and 439 so as to be 0.6 sccm, 150 sccm and 3 sccm, respectively, and the pressure inside the deposition chamber 417 was controlled so as to be 1.2 Torr.

Next, the power of the RF power source 422 was set to 0.07 $W/cm^3$, and RF power was fed to the plasma forming cup 420 to cause glow discharge. Thus, the second p-i-n RF n-type layer started being formed on the third p-i-n RF p-type layer, and a second p-i-n RF n-type layer with a layer thickness of 100 nm was formed, whereupon the RF power source was turned off to stop the glow discharge to complete the formation of the second p-i-n RF n-type layer 108.

The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.

To form a second p-i-n i-type layer 110 comprised of $\mu c$-Si, the gate valve 407 was opened to carry the substrate 490 (with the above layers formed thereon) into the transport chamber 403 and i-type layer deposition chamber 418 evacuated previously by means of a vacuum exhaust pump (not shown).

The substrate heater 411 was set so as to bring the temperature of the substrate 490 to 290° C. At the time the substrate was heated, the valves 461, 451, 450, 463 and 453 were opened slowly to flow $SiH_4$ gas and $H_2$ gas into the i-type layer deposition chamber 418 through the gas feed pipe 449.

Here, $SiH_4$ gas flow rate and $H_2$ gas flow rate were controlled by means of the corresponding mass flow controllers 456 and 458 so as to be 45 sccm and 1,500 sccm, respectively. The pressure inside the i-type layer deposition chamber 418 was controlled so as to be 0.04 Torr by adjusting the opening of the conductance valve (not shown).

Next, the power of the RF power source 424 was set to 0.15 $W/cm^3$ and was applied to the bias rod 428. Thereafter, the power of a microwave power source (not shown; 0.5 GHz) was set to 0.10 $W/cm^3$, and the microwave power was fed into the i-type layer deposition chamber 418 through the bias rod 428 to cause glow discharge. Thus, the second p-i-n i-type layer started being formed on the second p-i-n RF n-type layer, and a layer with a layer thickness of 0.8 $\mu m$ was formed, whereupon the glow discharge was stopped and the output from the bias power source 424 was stopped to complete the formation of the second p-i-n i-type layer 110.

The valves 451 and 453 were closed to stop the $SiH_4$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

To form a second p-i-n RF p-type layer 111 comprised of SiC, the substrate 490 (with the above layers formed thereon) was carried in the same manner as in the formation of the third p-i-n RF p-type layer 107. The subsequent procedure for the third p-i-n, RF p-type layer was repeated except that the $H_2$ gas flow rate, $SiH_4/H_2$ gas flow rate, $B_2H_6/H_2$ gas flow rate and $CH_4$ gas flow rate were controlled by means of the mass flow controllers so as to be 80 sccm, 3 sccm, 9 sccm and 0.2 sccm, respectively, and the deposition was carried out at a substrate temperature of 260° C.

To form a first p-i-n RF n-type layer 112 comprised of a-Si, first the gate valve 408 was opened to carry the substrate 490 (with the above layers formed thereon) into the transport chamber 403 and i-type layer deposition chamber 418 evacuated previously by means of a vacuum exhaust pump (not shown), and also the gate valve 407 was opened to carry the substrate 490 into the transport chamber 402 and n-type layer deposition chamber 417 evacuated previously by means of a vacuum exhaust pump (not shown).

$SiH_4$ gas flow rate, $H_2$ gas flow rate and $PH_3/H_2$ gas flow rate were controlled by means of the mass flow controllers 438, 436 and 439 so as to be 1.1 sccm, 45 sccm and 9 sccm, respectively, and the pressure inside the deposition chamber 417 was controlled by means of a conductance valve (not shown) so as to be 1.05 Torr. The substrate heater 410 was set so as to bring the temperature of the substrate 490 to 230° C. At the time the substrate temperature became stable, the first p-i-n RF n-type layer 112 comprised of a-Si was formed.

To form a first p-i-n RF i-type layer 113 comprised of a-Si, the substrate 490 (with the above layers formed thereon) was carried in the same manner as in the formation of the third p-i-n RF i-type layer 104. Thereafter, the substrate temperature was set to 195° C., the $Si_2H_6$ gas flow rate and $H_2$ gas flow rate were controlled by means of the mass flow controllers 464 and 463 so as to be 2 sccm and 200 sccm, respectively, and the pressure inside the deposition chamber 417 was controlled so as to be 0.75 Torr. At an RF power set at 0.007 $W/cm^3$, a first p-i-n RF i-type layer 113 with a layer thickness of 0.1 $\mu m$ was formed.

To form a first p-i-n RF p-type layer 114 comprised of SiC, the substrate 490 (with the above layers formed thereon) was carried in the same manner as in the formation of the third p-i-n RF p-type layer 107. The subsequent procedure for the third p-i-n RF p-type layer was repeated except that the $H_2$ gas flow rate, $SiH_4/H_2$ gas flow rate, $B_2H_6/H_2$ gas flow rate and $CH_4$ gas flow rate were controlled by means of the mass flow controllers so as to be 90 sccm, 3 sccm, 8 sccm and 0.4 sccm, respectively, and the deposition was carried out at a substrate temperature of 170° C.

Next, a gate valve 409 was opened to carry the substrate 490 (with the above layers formed thereon) into an unload chamber 405 evacuated previously by means of a vacuum exhaust pump (not shown), and a leak valve (not shown) was opened to let gases escape from the unload chamber 405.

Next, on the first p-i-n RF p-type layer 114, ITO was deposited by vacuum vapor deposition in a layer thickness of 70 nm as the transparent electrode 115.

Next, on the transparent electrode 115, a mask with a comb-shaped opening was placed, and a comb-shaped collector electrode 116 comprised of Cr(40 nm)/Ag(1,000 nm)/Cr(40 nm) was deposited by vapor deposition.

Thus, the fabrication of the photovoltaic device of the present example was completed. This photovoltaic device is herein called SCEx-1.

Comparative Example 1

In Example 1, the third p-i-n n-type layer was formed to be comprised of a-Si; the third p-i-n i-type layer, a-SiGe; the second p-i-n n-type layer, μc-Si; and the second p-i-n i-type layer, a-Si; which were all formed using RF power to produce a stacked photovoltaic device. This stacked photovoltaic device is herein called SCCp-1. The p-type, i-type and n-type layers other than the above were formed in the same manner as in Example 1.

Gas flow rates and other conditions are shown in Table 1.

For each of SCEx-1 and SCCp-1, five samples were prepared, and their loss of efficiency with respect to initial efficiency under irradiation by light of AM 1.5 (100 mW/cm$^2$) at 45° C. for 3,000 hours (hereinafter simply "rate of deterioration by light"), photoelectric conversion efficiency after stabilization (stabilized conversion efficiency), efficiency after being left in the dark at a temperature of 85° C. and a humidity of 85% RH for 2,100 hours (hereinafter simply "rate of heat-resistance deterioration"), cell breakdown voltage, and yield were measured.

The initial photoelectric conversion efficiency and stabilized conversion efficiency are determined by setting the resultant photovoltaic devices under irradiation by light of AM 1.5 (100 mW/cm$^2$) to measure V-I characteristics. As the result of measurement, the characteristics of SCCp-1 on the basis of those of SCEx-1 assumed as 1 were as shown in Table 2.

As can be seen from the foregoing, the stacked photovoltaic device SCEx-1 of the present invention is superior to the conventional stacked photovoltaic device SCCp-1 in stabilized conversion efficiency, rate of deterioration by light, rate of heat-resistance deterioration, cell breakdown voltage and yield.

Example 2

A photovoltaic device was produced in the same manner as in Example 1 except that the third p-i-n i-type layer 105 comprised of μc-Si was formed using VHF waves of 0.1 GHz in place of the microwaves.

The substrate heater 411 was set so as to bring the temperature of the substrate 490 to 330° C. At the time the substrate was heated, the valves 461, 451, 450, 463 and 453 were opened slowly to flow SiH$_4$ gas and H$_2$ gas into the i-type layer deposition chamber 418 through the gas feed pipe 449.

Here, SiH$_4$ gas flow rate and H$_2$ gas flow rate were controlled by means of the corresponding mass flow controllers 456 and 458 so as to be 60 sccm and 2,400 sccm, respectively. The pressure inside the i-type layer deposition chamber 418 was controlled so as to be 0.2 Torr by adjusting the opening of the conductance valve (not shown).

Next, the power of a VHF power source (not shown; 0.1 GHz) was set to 0.15 W/cm$^3$ and was applied to the bias rod 428 to cause glow discharge. Thus, the third p-i-n i-type layer started being formed on the third p-i-n RF n-type layer, and an i-type with a layer thickness of 2.5 μm was formed, whereupon the glow discharge was stopped to complete the formation of the third p-i-n i-type layer 105.

The valves 451 and 453 were closed to stop the SiH$_4$ gas and H$_2$ gas from flowing into the i-type layer deposition chamber 418, and then the inside of the i-type layer deposition chamber 418 and the inside of the gas pipe were evacuated to have a pressure of 1×10$^{-5}$ Torr.

The stacked photovoltaic device thus obtained is called SCEx-2.

Comparative Example 2

In Example 1, the third p-i-n n-type layer was formed to be comprised of a-Si; the third p-i-n i-type layer, a-SiGe; the second p-i-n n-type layer, a-Si; and the second p-i-n i-type layer, a-SiGe; which were all formed using RF power to produce a stacked photovoltaic device. This stacked photovoltaic device is herein called SCCp-2. The p-type, i-type and n-type layers other than the above were formed in the same manner as in Example 1.

Gas flow rates and other conditions are shown in Table 3.

For each of SCEx-2 and SCCp-2, four samples were prepared. Their photoelectric conversion efficiency after stabilization (stabilized conversion efficiency), rate of deterioration by light, rate of heat-resistance deterioration, cell breakdown voltage, and yield were measured, and their average values were calculated.

As the result of measurement, the characteristics of SCCp-2 on the basis of those of SCEx-2 assumed as 1 were as shown in Table 4.

As can be seen from the foregoing, the stacked photovoltaic device SCEx-2 of the present invention is superior to the conventional stacked photovoltaic device SCCp-2 in photoelectric conversion efficiency after stabilization (stabilized conversion efficiency), rate of deterioration by light, rate of heat-resistance deterioration, cell breakdown voltage and yield.

Example 3

In Example 1, to form the second p-i-n i-type layer 110 comprised of μc-Si, SiH$_4$ gas flow rate and H$_2$ gas flow rate were controlled by means of the corresponding mass flow controllers 456 and 458 so as to be 70 sccm and 2,100 sccm, respectively. The pressure inside the i-type layer deposition chamber 418 was controlled so as to be 0.05 Torr by adjusting the opening of the conductance valve (not shown).

Next, the power of the RF power source 424 was set to 0.15 W/cm$^3$ and was applied to the bias rod 428. Thereafter, the power of a VHF power source (not shown; 0.5 GHz) was set to 0.12 W/cm$^3$, and VHF power was fed into the i-type layer deposition chamber 418 through the bias rod 428 to cause glow discharge. Thus, the second p-i-n i-type layer started being formed on the second p-i-n RF n-type layer, and an i-type with a layer thickness of 1.0 μm was formed, whereupon the glow discharge was stopped and the output from the bias power source 424 was stopped to complete the formation of the second p-i-n, i-type layer 110.

In the same way, eight samples were prepared in which only the layer thickness of the second p-i-n i-type layer 110 comprised of μc-Si was changed in the range of from 0.3 μm to 2.0 μm, and their initial photoelectric conversion efficiency, fill factor, and rate of deterioration by light were measured.

Results obtained are shown in Table 5.

In respect of the initial photoelectric conversion efficiency, fill factor and rate of deterioration by light, those sufficient for practical use were obtained when the i-type layer 110 was formed in a layer thickness ranging from 0.5 μm to 1.5 μm.

In the stacked photovoltaic device of the present invention, those having superior characteristics were obtained when the second p-i-n i-type layer 110 comprised of μc-Si was formed in a layer thickness ranging from 0.5 μm to 1.5 μm.

Example 4

In Example 1, to form the third p-i-n i-type layer 105 comprised of μc-Si, SiH$_4$ gas flow rate and H$_2$ gas flow rate were controlled by means of the corresponding mass flow controllers 456 and 458 so as to be 80 sccm and 3,200 sccm, respectively. The pressure inside the i-type layer deposition chamber 418 was controlled so as to be 0.2 Torr by adjusting the opening of the conductance valve (not shown).

Next, the power of a VHF power source (not shown; 0.1 GHz) was set to 0.15 W/cm$^3$, and VHF power was fed into the i-type layer deposition chamber 418 through the bias rod 428 to cause glow discharge. Thus, the third p-i-n i-type layer started being formed on the third p-i-n RF n-type layer, and an i-type with a layer thickness of 3.0 μm was formed, whereupon the glow discharge was stopped and the output from the bias power source 424 was stopped to complete the formation of the third p-i-n, i-type layer 105.

In the same way, eight samples were prepared in which only the layer thickness of the third p-i-n i-type layer 105 comprised of μc-Si was changed in the range of from 1.0 μm to 4.0 μm, and their initial photoelectric conversion efficiency, fill factor, and rate of deterioration by light were measured.

Results obtained are shown in Table 6.

In respect of the initial photoelectric conversion efficiency, fill factor and rate of deterioration by light, those sufficient for practical use were obtained when the i-type layer 105 was formed in a layer thickness ranging from 1.5 μm to 3.5 μm.

In the stacked photovoltaic device of the present invention, those having superior characteristics were obtained when the third p-i-n i-type layer 105 comprised of μc-Si was formed in a layer thickness ranging from 1.5 μm to 3.5 μm.

Example 5

In Example 1, the second p-i-n n-type layer 108 was formed in the same way. To form the second p-i-n i-type layer 110 comprised of μc-Si, $SiH_4$ gas flow rate and $H_2$ gas flow rate were controlled by means of the corresponding mass flow controllers 456 and 458 so as to be 55 sccm and 1,500 sccm, respectively, and also $B_2H_6/H_2$ gas flow rate was controlled by means of the mass flow controller 460 so that boron content in microcrystalline silicon of the second p-i-n i-type layer 110 ranged from 0 ppm to 10.0 ppm. Thus, photovoltaic devices were produced. The n-type, i-type and p-type layers other than the above were formed in the same manner as in Example 1.

The boron content in the second p-i-n i-type layer 110 was measured using IMF-4F, manufactured by Cameca Co.

In those having the second p-i-n i-type layer 110 in which the boron contained in silicon was in an mount of 8.0 ppm or less, superior characteristics were obtained with respect to all of initial photoelectric conversion efficiency, stabilized conversion efficiency, rate of deterioration by light and rate of heat-resistance deterioration.

Results obtained are shown in Table 7.

Example 6

In Example 1, the third p-i-n n-type layer 103 was formed in the same way. To form the third p-i-n i-type layer 105 comprised of μc-Si, $SiH_4$ gas flow rate and $H_2$ gas flow rate were controlled by means of the corresponding mass flow controllers 456 and 458 so as to be 45 sccm and 1,550 sccm, respectively, and also $B_2H_6/H_2$ gas flow rate was controlled by means of the mass flow controller 460 so that boron content in microcrystalline silicon of the third p-i-n i-type layer 105 ranged from 0 ppm to 10.0 ppm, thus photovoltaic devices were produced. The n-type, i-type and p-type layers other than the above were formed in the same manner as in Example 1.

The boron content in the third p-i-n i-type layer 105 was measured using IMF-4F, manufactured by Cameca Co.

In those having the third p-i-n i-type layer 105 in which the boron contained in silicon was in an mount of 8.0 ppm or less, superior characteristics were obtained with respect to all of initial photoelectric conversion efficiency, stabilized conversion efficiency, rate of deterioration by light and rate of heat-resistance deterioration.

Results obtained are shown in Table 8.

Example 7

In Example 1, a photovoltaic device was produced in which a second p-i-n RF n-type layer comprised of a-Si was provided additionally between the layers 107 and 108. FIG. 2 illustrates a cross-sectional structure of such a stacked photovoltaic device.

To form the second p-i-n RF n-type layer comprised of a-Si, the valves 443, 433, 444 and 434 were operated to feed $SiH_4$ gas and $PH_3/H_2$ gas into the deposition chamber 417 through the gas feed pipe 429.

Here, $SiH_4$ gas flow rate, $H_2$ gas flow rate and $PH_3/H_2$ gas flow rate were controlled by means of the mass flow controllers 438, 436 and 439 so as to be 3 sccm, 80 sccm and 5 sccm, respectively, and the pressure inside the deposition chamber 417 was controlled so as to be 1.0 Torr.

The power of the RF power source 422 was set to 0.03 $W/cm^3$, and RF power was fed to the plasma forming cup 420 to cause glow discharge. Thus, an RF n-type layer 208 started being formed on the third p-i-n p-type layer 207, and the second p-i-n RF n-type layer with a layer thickness of 10 nm was formed, whereupon the RF power source was turned off to stop the glow discharge to complete the formation of a second p-i-n RF n-type layer 208.

The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr. An n-type layer 209 comprised of μc-Si was further formed in the same manner as in Example 1 in a layer thickness of 10 nm.

Other deposited layers were formed in the same manner as in Example 1 to obtain the stacked photovoltaic device as shown in FIG. 2. This photovoltaic device is herein called SCEx-7.

Comparative Example 7

In Example 1, the third p-i-n n-type layer was formed to be comprised of a-Si; the third p-i-n, i-type layer, a-SiGe; the second p-i-n, n-type layer, a-Si; and the second p-i-n, i-type layer, a-Si; which were all formed using RF power to produce a stacked photovoltaic device. This photovoltaic device is herein called SCCp-7. The p-type, i-type and n-type layers other than the above were formed in the same manner as in Example 1.

Gas flow rates and other conditions are shown in Table 9.

For each of SCEx-7 and SCCp-7, six samples were prepared. Their stabilized conversion efficiency, rate of deterioration by light, rate of heat-resistance deterioration, cell breakdown voltage, and yield were measured in the same manner as in Comparative Example 1, and their average values were calculated. As the result of measurement, the characteristics of SCCp-7 on the basis of those of SCEx-7 assumed as 1 were as shown in Table 10.

As can be seen from the foregoing, the stacked photovoltaic device SCEx-7 of the present invention is superior to the conventional stacked photovoltaic device SCCp-7 in stabilized conversion efficiency, rate of deterioration by light, rate of heat-resistance deterioration, cell breakdown voltage and yield.

Example 8

In the same manner as in Example 1 to form the μc-Si layer i-type layer 110 of the second p-i-n junction, the rate of dilution with hydrogen, substrate temperature and so forth were changed previously to study production conditions providing different optical absorption coefficients at 950 nm.

Thereafter, four stacked photovoltaic devices having different optical absorption coefficients at 950 nm were produced by using the above production conditions when in Example 1 the μc-Si layer i-type layer 110 of the second p-i-n junction was formed. Then, evaluation was made in the same manner as in Example 1.

The results of evaluation are shown in Table 11.

As can be seen from the foregoing, the stacked photovoltaic device SCEx-8 of the present invention has superior characteristics with respect to all of initial photoelectric conversion efficiency, stabilized conversion efficiency, rate of deterioration by light and rate of heat-resistance deterioration when its microcrystalline silicon i-type layer of the second p-i-n junction is made to have an optical absorption coefficient of 200 cm$^{-1}$ or above at 950 nm.

Example 9

In the same manner as in Example 1 to form the μc-Si layer i-type layer 105 of the third p-i-n junction, the rate of dilution with hydrogen, substrate temperature and so forth were changed previously to study production conditions providing different optical absorption coefficients at 950 nm. Thereafter, four stacked photovoltaic devices having different optical absorption coefficients at 950 nm were produced by using the above production conditions when in Example 1 the μc-Si layer i-type layer 105 of the third p-i-n junction was formed. Then, evaluation was made in the same manner as in Example 1.

The results of evaluation are shown in Table 12.

As can be seen from the foregoing, the stacked photovoltaic device SCEx-9 of the present invention has superior characteristics with respect to all of initial photoelectric conversion efficiency, stabilized conversion efficiency, rate of deterioration by light and rate of heat-resistance deterioration when its microcrystalline silicon i-type layer of the third p-i-n junction is made to have an optical absorption coefficient of 200 cm$^{-1}$ or above at 950 nm.

Example 10

Figure 5:
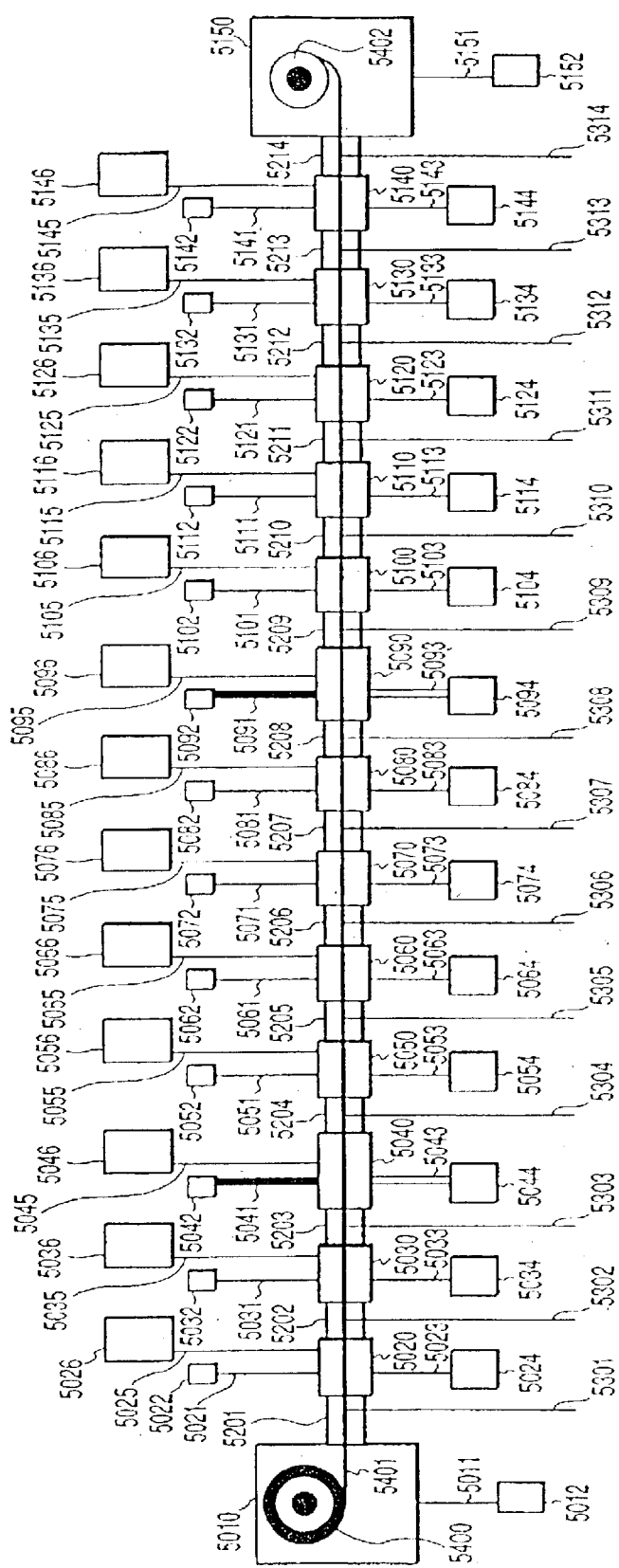
FIG. 5 is a diagrammatic cross-sectional view for illustrating an example of a production system suited for forming the stacked photovoltaic device of the present invention continuously on a continuous substrate.

The triple type photovoltaic device as shown in FIG. 3 was produced using a deposition system employing a roll-to-roll system as shown in FIG. 5. In FIG. 5, reference numeral 5010 denotes a load chamber; 5400, a substrate wound up in a role in the load chamber; 5150, an unload chamber; and 5402, a wind-up jig provided in the unload chamber.

Reference numeral 5120 denotes a first p-i-n n-type layer deposition chamber; 5130, a first p-i-n RF i-type layer (p/i) deposition chamber; and 5140, a first p-i-n p-type layer deposition chamber. Also, reference numeral 5070 denotes a deposition chamber for a second p-i-n n-type layer; 5090, a deposition chamber for a second p-i-n MW i-type layer; and 5110, a second p-i-n p-type layer deposition chamber. Still also, reference numerals 5020 and 5030 denote third p-i-n n-type layer deposition chambers; 5040, a third p-i-n MW i-type layer deposition chamber; 5050, a third p-i-n RF i-type layer (p/i) deposition chamber; and 5060, a third p-i-n p-type layer deposition chamber.

Reference numerals 5011, 5021, 5031, 5041, 5051, 5061, 5071, 5091, 5111, 5121, 5131, 5141 and 5151 denote exhaust pipes; and 5012, 5022, 5032, 5042, 5052, 5062, 5072, 5092, 5112, 5122, 5132, 5142 and 5152 denote exhaust pumps connected to the exhaust pipes.

Reference numerals 5201 to 5214 denotes gas gates; and 5301 to 5314 denote gas feed pipes. Also, reference numerals 5025, 5035, 5045, 5055, 5065, 5075, 5095, 5115, 5125, 5135 and 5145 denote material gas feed pipes; and 5026, 5036, 5046, 5056, 5066, 5076, 5096, 5116, 5126, 5136 and 5146 denote material gas mixing systems.

Reference numerals 5024, 5034, 5054, 5064, 5074, 5114, 5124, 5134 and 5144 denote RF power sources; and 5023, 5033, 5053, 5063, 5073, 5113, 5123, 5133 and 5143 denote coaxial cables for RF power supply. Also, reference numerals 5044 and 5094 denote MW power sources; and 5043 and 5093 denote MW-introducing waveguides.

As the substrate, a sheet-like substrate 300 m long, 30 cm wide and 0.2 mm thick having thereon a light reflecting layer (metal layer and transparent conductive layer) was used.

Then, the sheet-like substrate having the light reflecting layer was set in the load chamber 5010 for feeding the substrate. Conditions for forming the triple type photovoltaic devices are shown in Table 13.

The sheet-like substrate was passed through all the deposition chambers and all the gas gates and connected to the sheet wind-up jig in the unload chamber 5150. The respective deposition chambers were evacuated to 10$^{-3}$ Torr or below by means of exhaust systems (not shown). The desired material gases were fed into the respective deposition chambers from the deposited film forming mixing systems 5026, 5036, 5046, 5056, 5066, 5076, 5096, 5116, 5126, 5136 and 5146. To the gas gates 5201 to 5214, gas was fed from the respective gas gate feeding system.

The substrate was heated by means of the substrate heater in each deposition system, and the degree of vacuum was controlled by adjusting the opening of the exhaust valve of each exhaust system. After the substrate temperature and degree of vacuum became stable, the substrate was begun to be transported, and RF power, VHF wave or microwave (frequency: 0.5 GHz, 2.45 GHz) power for generating plasma was supplied to each deposition chamber.

In this way, the triple type photovoltaic device having the three p-i-n junctions superposed as shown in FIG. 3 was formed on the sheet-like substrate over a length of 100 m. In the formation of the second p-i-n i-type layer, VHF waves (0.5 GHz) were applied. In the formation of the third p-i-n i-type layer, microwaves (2.45 GHz) were applied.

Next, on the RF p-type layer 114, ITO was deposited by vacuum vapor deposition in a layer thickness of 70 nm as the transparent electrode 115.

Then, on the transparent electrode 115, a mask with a comb-shaped opening was placed, and the comb-shaped collector electrode 116 comprised of Cr(40 nm)/Ag(1,000 nm)/Cr(40 nm) was deposited by vapor deposition. Thus, the fabrication of the stacked photovoltaic device was completed. This photovoltaic device is herein called SCEx-10.

Comparative Example 10

Under the same conditions as in Example 10, like Comparative Example 1, third p-i-n RF n-type layer, i-type layer, MW i-type layer, RF i-type layer and p-type layer, second p-i-n RF n-type layer, i-type layer and p-type layer, and first p-i-n RF n-type layer, i-type layer and p-type layer were formed on the substrate having the reflecting layer to produce a stacked photovoltaic device in which a-Si was used in the second p-i-n RF n-type layer and a-Si was used in the second p-i-n i-type layer.

For each of SCEx-10 and SCCp-10, eight samples were prepared. Their stabilized conversion efficiency, rate of deterioration by light, rate of heat-resistance deterioration, cell breakdown voltage and yield were measured, and their average values were calculated. As the result of measurement, the characteristics of SCCp-10 on the basis of those of SCEx-10 assumed as 1 were as shown in Table 14.

As can be seen from the foregoing, the stacked photovoltaic device SCEx-10 of the present invention is superior to the conventional stacked photovoltaic device SCCp-10 in stabilized conversion efficiency, rate of deterioration by light, rate of heat-resistance deterioration, cell breakdown voltage and yield.

As described above, according to the present invention, the use of a microcrystalline silicon layer as the i-type layer of the second p-i-n junction and a microcrystalline silicon layer as the i-type layer of the third p-i-n junction brings about an improvement in semiconductor layers which have hitherto undergone great deterioration by light in amorphous silicon type stacked photovoltaic devices. The use of such layers makes it possible to further restrain the deterioration by light, as compared to any conventional stacked photovoltaic devices.

The use of a microcrystalline silicon layer as the i-type layer of the third p-i-n junction also makes it possible to absorb long wavelength light which has hitherto been relatively difficult to absorb, to achieve higher short circuit current and open circuit voltage than any conventional stacked photovoltaic devices, and also to maintain a high photoelectric conversion efficiency.

With regard to the layer thickness of the microcrystalline silicon layer which is the i-type layer of the second p-i-n junction and/or the layer thickness of the microcrystalline silicon layer which is the i-type layer of the third p-i-n junction, making it/them smaller than the layer thickness having hitherto been considered suitable make(s) it possible to restrain localized levels in the i-type layer from increasing as a result of irradiation by light and to further restrain the deterioration by light, as compared to any conventional stacked photovoltaic devices.

Incorporation of boron in the microcrystalline silicon layer which is the i-type layer of the second p-i-n junction and setting its content to be not more than 8 ppm and/or incorporation of boron in the microcrystalline silicon layer which is the i-type layer of the third p-i-n junction and setting its content to be not more than 8 ppm make(s) it possible not to inhibit the growth of microcrystals and to improve the movability of holes at the time of electricity generation by light to thereby maintain a high photoelectric conversion efficiency while restraining the deterioration by light.

Formation of the n-type layer of the second p-i-n junction by a microcrystalline silicon layer or by a double layer consisting of a microcrystalline silicon layer and an amorphous silicon layer and/or formation of the n-type layer of the third p-i-n junction by a microcrystalline silicon layer or by a double layer consisting of a microcrystalline silicon layer and an amorphous silicon layer make(s) it possible to form at a high deposition rate the microcrystalline silicon of the i-type layer formed on the n-type layer, to form good quality microcrystalline silicon having fewer impurities and to maintain a high photoelectric conversion efficiency with less deterioration by light.

In addition, with regard to the microcrystalline silicon layers which are the i-type layers of the second and third p-i-n junctions, their formation by plasma CVD using a high frequency power of from 0.1 GHz to 10 GHz and making these layers each have an optical absorption coefficient of 200 cm$^{-1}$ or above at 950 nm make it possible to form the microcrystalline silicon layers which are the i-type layers of the second and third p-i-n junctions, in a layer thickness smaller than the layer thickness having hitherto been considered suitable, to restrain localized levels in the i-type layer from increasing as a result of irradiation by light and to further restrain the deterioration by light, as compared to any conventional stacked photovoltaic devices. This also makes it possible to absorb long wavelength light which has hitherto been relatively difficult to absorb and to achieve higher photoelectric conversion efficiency than any conventional stacked photovoltaic devices.

The formation of the stacked photovoltaic device of the present invention by the roll-to-roll system makes it possible to improve productivity very much.

Thus, the stacked photovoltaic device of the present invention makes it possible to restrain deterioration by light, to make deterioration by light occur less while maintaining a high photoelectric conversion efficiency and to improve the photoelectric conversion efficiency after deterioration by light. Hence, a stacked photovoltaic device can be provided which is practical and low-cost and has high reliability and high photoelectric conversion efficiency.

According to the present invention, the use of microcrystalline silicon in the i-type layer of the second p-i-n junction and microcrystalline silicon in the i-type layer of the third p-i-n junction also makes it possible to improve breakdown voltage, resistance to deterioration by heat and production process yield of the whole photovoltaic device, and to improve flexibility of the form in which the photovoltaic device is utilized.

TABLE 1

| Comparative Example 1 | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^3$) | RF power (W/cm$^3$) | Substrate temp. (° C.) | Layer thickness (nm) |
|---|---|---|---|---|---|---|---|---|---|---|---|---|---|
| RF n-type layer: | 2.2 | — | — | — | 80 | 10 | — | — | 1.3 | — | 0.05 | 380 | 10 |
| RF i-type layer: | — | 3.5 | — | — | 100 | — | — | — | 0.65 | — | 0.008 | 300 | 10 |
| MW i-type layer: | 48 | — | — | 51 | 170 | — | — | — | 0.01 | 0.1 | 0.32 | 380 | 170 |
| RF i-type layer: | — | 3.5 | — | — | 100 | — | — | — | 0.65 | — | 0.008 | 300 | 23 |
| RF p-type layer: | — | — | 0.1 | — | 80 | — | 9 | 3 | 1.8 | — | 0.07 | 300 | 10 |
| RF n-type layer: | 0.5 | — | — | — | 100 | 8 | — | — | 1.2 | — | 0.1 | 320 | 10 |
| MW i-type layer: | 80 | — | — | — | 250 | — | — | — | 0.02 | 0.1 | 0.205 | 320 | 350 |
| RF p-type layer: | — | — | 0.2 | — | 80 | — | 9 | 3 | 1.7 | — | 0.07 | 260 | 10 |
| RF n-type layer: | 1.1 | — | — | — | 50 | 10 | — | — | 1.05 | — | 0.04 | 230 | 10 |
| RF i-type layer: | — | 2.0 | — | — | 200 | — | — | — | 0.8 | — | 0.007 | 190 | 90 |
| RF p-type layer: | — | — | 0.4 | — | 90 | — | 8 | 3 | 1.6 | — | 0.07 | 170 | 10 |

TABLE 2

| Sample | Stabilized conversion efficiency | Rate of deterioration by light | Rate of heat-resistance deterioration | Cell breakdown voltage | Yield |
|---|---|---|---|---|---|
| SCEx-1 | 1 | 1 | 1 | 1 | 1 |
| SCCp-1 | 0.9 | 1.18 | 1.14 | 0.99 | 0.98 |

TABLE 3

| Comparative Example 2 | SiH₄ Flow rate (sccm) | Si₂H₆ Flow rate (sccm) | CH₄ Flow rate (sccm) | GeH₄ Flow rate (sccm) | H₂ Flow rate (sccm) | PH₃/H₂ Flow rate (sccm) | B₂H₆/H₂ Flow rate (sccm) | SiH₄/H₂ Flow rate (sccm) | Pressure (Torr) | MW power (W/cm³) | RF power (W/cm³) | Substrate temp. (°C.) | Layer thickness (nm) |
|---|---|---|---|---|---|---|---|---|---|---|---|---|---|
| RF n-type layer: | 2.2 | — | — | — | 80 | 10 | — | — | 1.3 | — | 0.05 | 370 | 10 |
| RF i-type layer: | — | 3.5 | — | — | 90 | — | — | — | 0.65 | — | 0.008 | 300 | 10 |
| MW i-type layer: | 48 | — | — | 53 | 170 | — | — | — | 0.02 | 0.1 | 0.32 | 370 | 170 |
| RF i-type layer: | — | 3.5 | — | — | 90 | — | — | — | 0.67 | — | 0.008 | 300 | 20 |
| RF p-type layer: | — | — | 0.1 | — | 80 | — | 8 | 3 | 1.8 | — | 0.07 | 300 | 10 |
| RF n-type layer: | 2.0 | — | — | — | 70 | 8 | — | — | 1.2 | — | 0.07 | 320 | 10 |
| MW i-type layer: | 50 | — | — | 35 | 250 | — | — | — | 0.02 | 0.1 | 0.205 | 320 | 140 |
| RF p-type layer: | — | — | 0.2 | — | 80 | — | 8 | 3 | 1.8 | — | 0.07 | 250 | 10 |
| RF n-type layer: | 1.3 | — | — | — | 50 | 10 | — | — | 1.05 | — | 0.04 | 230 | 10 |
| RF i-type layer: | — | 2.0 | — | — | 100 | — | — | — | 0.8 | — | 0.007 | 180 | 90 |
| RF p-type layer: | — | — | 0.4 | — | 90 | — | 8 | 3 | 1.6 | — | 0.07 | 170 | 10 |

TABLE 4

| Sample | Stabilized conversion efficiency | Rate of deterioration by light | Rate of heat-resistance deterioration | Cell breakdown voltage | Yield |
|---|---|---|---|---|---|
| SCEx-2 | 1 | 1 | 1 | 1 | 1 |
| SCCp-2 | 0.92 | 1.12 | 1.13 | 0.97 | 0.99 |

TABLE 5

| Layer thickness of i-type layer of 2nd p-i-n: (μm) | 0.3 | 0.5 | 0.7 | 1 | 1.2 | 1.5 | 1.8 | 2.0 |
|---|---|---|---|---|---|---|---|---|
| Initial photoelectric conversion efficiency: | C | A | A | A | A | A | B | B |
| Fill factor: | B | B | A | A | A | A | B | C |
| Rate of deterioration by light: | B | A | A | A | A | A | B | B |

A: Optimum for practical use
B: Sufficient for practical use
C: Insufficient for practical use

TABLE 6

| Layer thickness of i-type layer of 3rd p-i-n: (μm) | 1 | 1.5 | 2 | 2.5 | 3 | 3.5 | 3.8 | 4.0 |
|---|---|---|---|---|---|---|---|---|
| Initial photoelectric conversion efficiency: | C | A | A | A | A | A | B | C |
| Fill factor: | B | A | A | A | A | A | B | C |
| Rate of deterioration by light: | B | A | A | A | A | A | B | B |

A: Optimum for practical use
B: Sufficient for practical use
C: Insufficient for practical use

TABLE 7

| Boron (B) content in i-type layer of 2nd p-i-n: (ppm) | 0 | 1 | 3 | 8 | 10 |
|---|---|---|---|---|---|
| Initial photoelectric conversion efficiency: | A | A | A | B | C |
| Stabilized photoelectric conversion efficiency: | A | A | A | B | B |
| Rate of deterioration by light: | A | A | A | A | B |
| Rate of heat-resistance deterioration: | A | A | A | A | B |

A: Optimum for practical use
B: Sufficient for practical use
C: Insufficient for practical use

TABLE 8

| Boron (B) content in i-type layer of 3rd p-i-n: (ppm) | 0 | 1 | 3 | 8 | 10 |
|---|---|---|---|---|---|
| Initial photoelectric conversion efficiency: | A | A | A | B | C |
| Stabilized photoelectric conversion efficiency: | A | A | A | B | B |
| Rate of deterioration by light: | A | A | A | A | B |
| Rate of heat-resistance deterioration: | A | A | A | A | B |

A: Optimum for practical use
B: Sufficient for practical use
C: Insufficient for practical use

TABLE 9

| Comparative Example 7 | SiH₄ Flow rate (sccm) | Si₂H₆ Flow rate (sccm) | CH₄ Flow rate (sccm) | GeH₄ Flow rate (sccm) | H₂ Flow rate (sccm) | PH₃/H₂ Flow rate (sccm) | B₂H₆/H₂ Flow rate (sccm) | SiH₄/H₂ Flow rate (sccm) | Pressure (Torr) | MW power (W/cm³) | RF power (W/cm³) | Substrate temp. (°C.) | Layer thickness (nm) |
|---|---|---|---|---|---|---|---|---|---|---|---|---|---|
| RF n-type layer: | 2.2 | — | — | — | 80 | 10 | — | — | 1.3 | — | 0.05 | 380 | 10 |
| RF i-type layer: | — | 3.5 | — | — | 100 | — | — | — | 0.65 | — | 0.008 | 300 | 10 |

TABLE 9-continued

| Comparative Example 7 | SiH₄ Flow rate (sccm) | Si₂H₆ Flow rate (sccm) | CH₄ Flow rate (sccm) | GeH₄ Flow rate (sccm) | H₂ Flow rate (sccm) | PH₃/H₂ Flow rate (sccm) | B₂H₆/H₂ Flow rate (sccm) | SiH₄/H₂ Flow rate (sccm) | Pressure (Torr) | MW power (W/cm³) | RF power (W/cm³) | Substrate temp. (°C.) | Layer thickness (nm) |
|---|---|---|---|---|---|---|---|---|---|---|---|---|---|
| MW i-type layer: | 48 | — | — | 51 | 170 | — | — | — | 0.01 | 0.1 | 0.32 | 380 | 170 |
| RF i-type layer: | — | 3.5 | — | — | 100 | — | — | — | 0.65 | — | 0.008 | 300 | 23 |
| RF p-type layer: | — | — | 0.1 | — | 80 | — | 9 | 3 | 1.8 | — | 0.07 | 300 | 10 |
| RF n-type layer: | 1.8 | — | — | — | 70 | 8 | — | — | 1.2 | — | 0.008 | 320 | 10 |
| MW i-type layer: | 80 | — | — | — | 350 | — | — | — | 0.02 | 0.1 | 0.205 | 300 | 350 |
| RF p-type layer: | — | — | 0.2 | — | 80 | — | 9 | 3 | 1.7 | — | 0.07 | 260 | 10 |
| RF n-type layer: | 1.1 | — | — | — | 50 | 10 | — | — | 1.05 | — | 0.04 | 230 | 10 |
| RF i-type layer: | — | 2.0 | — | — | 200 | — | — | — | 0.8 | — | 0.007 | 190 | 90 |
| RF p-type layer: | — | — | 0.4 | — | 90 | — | 8 | 3 | 1.6 | — | 0.07 | 170 | 10 |

TABLE 10

| Sample | Stabilized conversion efficiency | Rate of deterioration by light | Rate of heat-resistance deterioration | Cell breakdown voltage | Yield |
|---|---|---|---|---|---|
| SCEx-7 | 1 | 1 | 1 | 1 | 1 |
| SCCp-7 | 0.88 | 1.20 | 1.15 | 0.99 | 0.99 |

TABLE 11

| Optical absorption coefficient at 950 nm of i-type layer of 2nd p-i-n: (cm-1) | ≦10 | 100 | 200 | 400 |
|---|---|---|---|---|
| Initial photoelectric conversion efficiency: | C | C | A | A |
| Stabilized photoelectric conversion efficiency: | C | B | A | A |
| Rate of deterioration by light: | C | C | A | A |
| Rate of heat-resistance deterioration: | C | B | A | A |

A: Optimum for practical use
B: Sufficient for practical use
C: Insufficient for practical use

TABLE 12

| Optical absorption coefficient at 950 nm of i-type layer of 3rd p-i-n: (cm-1) | ≦10 | 100 | 200 | 400 |
|---|---|---|---|---|
| Initial photoelectric conversion efficiency: | C | C | A | A |
| Stabilized photoelectric conversion efficiency: | C | C | A | A |
| Rate of deterioration by light: | C | B | A | A |
| Rate of heat-resistance deterioration: | C | B | A | A |

A: Optimum for practical use
B: Sufficient for practical use
C: Insufficient for practical use

TABLE 13

| Example 10 | SiH₄ Flow rate (sccm) | Si₂H₆ Flow rate (sccm) | CH₄ Flow rate (sccm) | GeH₄ Flow rate (sccm) | H₂ Flow rate (sccm) | PH₃/H₂ Flow rate (sccm) | B₂H₆/H₂ Flow rate (sccm) | SiH₄/H₂ Flow rate (sccm) | Pressure (Torr) | MW power (W/cm³) | RF power (W/cm³) | Substrate temp. (°C.) | Layer thickness (nm) |
|---|---|---|---|---|---|---|---|---|---|---|---|---|---|
| RF n-type layer: | 2.2 | — | — | — | 75 | 10 | — | — | 1.3 | — | 0.05 | 380 | 10 |
| RF n-type layer: | 0.2 | — | — | — | 100 | 5 | — | — | 0.65 | — | 0.1 | 290 | 13 |
| MW i-type layer: | 48 | — | — | — | 1,600 | — | — | — | 0.05 | 0.10 | 0.32 | 300 | 3,000 |
| RF i-type layer: | — | 4.0 | — | — | 100 | — | — | — | 0.65 | — | 0.008 | 290 | 23 |
| RF p-type layer: | — | — | 0.1 | — | 80 | — | 9 | 4 | 1.8 | — | 0.08 | 300 | 10 |
| RF n-type layer: | 0.2 | — | — | — | 150 | 8 | — | — | 0.7 | — | 0.08 | 320 | 100 |
| MW i-type layer: | 80 | — | — | — | 1,300 | — | — | — | 0.1 | 0.15 | 0.12 | 300 | 1,000 |
| RF p-type layer: | — | — | 0.2 | — | 80 | — | 9 | 4 | 1.7 | — | 0.08 | 260 | 10 |
| RF n-type layer: | 1.1 | — | — | — | 50 | 10 | — | — | 1.05 | — | 0.04 | 220 | 10 |
| RF i-type layer: | — | 2.0 | — | — | 200 | — | — | — | 0.8 | — | 0.007 | 190 | 90 |
| RF p-type layer: | — | — | 0.4 | — | 90 | — | 8 | 3 | 1.6 | — | 0.08 | 160 | 10 |

TABLE 14

| Sample | Stabilized conversion efficiency | Rate of deterioration by light | Rate of heat-resistance deterioration | Cell breakdown voltage | Yield |
|---|---|---|---|---|---|
| SCEx-10 | 1 | 1 | 1 | 1 | 1 |
| SCCp-10 | 0.89 | 1.21 | 1.14 | 0.99 | 0.98 |

What is claimed is:

1. A stacked photovoltaic device comprising at least three p-i-n junction constituent devices superposed in layers, each having a p-type layer, an i-type layer and an n-type layer which are formed of non-single crystal semiconductors comprising silicon, wherein an amorphous silicon layer is used as the i-type layer of a first p-i-n junction, a microcrystalline silicon layer is used as the i-type layer of a second p-i-n junction and a microcrystalline silicon layer is used as the i-type layer of a third p-i-n junction; the first to third p-i-n junction layers being in the order from a light-incident side; and wherein an amorphous silicon layer or an amorphous silicon carbide layer is provided between the p-type layer and the i-type layer of the second p-i-n junction.

2. The stacked photovoltaic device according to claim 1, wherein the amorphous silicon layer between the p-type layer and the i-type layer of the second p-i-n junction or the amorphous silicon carbide layer has a thickness of 30 to 450 angstroms.

3. A stacked photovoltaic device comprising at least three p-i-n junction constituent devices superposed in layers, each having a p-type layer, an i-type layer and an n-type layer which are formed of non-single crystal semiconductors comprising silicon, wherein an amorphous silicon layer is used as the i-type layer of a first p-i-n junction, a microcrystalline silicon layer is used as the i-type layer of a second p-i-n junction and a microcrystalline silicon layer is used as the i-type layer of a third p-i-n junction; the first to third p-i-n junction layers being in the order from a light-incident side; and wherein an amorphous silicon layer or an amorphous silicon carbide layer is provided between the p-type layer and the i-type layer of the third p-i-n junction.

4. The stacked photovoltaic device according to claim 3, wherein the amorphous silicon layer between the p-type layer and the i-type layer of the third p-i-n junction or the amorphous silicon carbide layer has a thickness of 30 to 450 angstroms.

5. The stacked photovoltaic device according to claim 1, wherein the i-type layer of the second or of the third p-i-n junction has an optical absorption coefficient of 200 $cm^{-1}$ or above at 950 nm.

6. The stacked photovoltaic device according to claim 3, wherein the i-type layer of the second or of the third p-i-n junction has an optical absorption coefficient of 200 $cm^{-1}$ or above at 950 nm.

* * * * *

UNITED STATES PATENT AND TRADEMARK OFFICE
CERTIFICATE OF CORRECTION

PATENT NO. : 6,835,888 B2
DATED : December 28, 2004
INVENTOR(S) : Masafumi Sano et al.

It is certified that error appears in the above-identified patent and that said Letters Patent is hereby corrected as shown below:

Column 12,
Line 24, "Cr." should read -- Cr, --.

Column 16,
Line 58, "$Si_2D_3H_3H_3$," should read -- $Si_2D_3H_3$, --.

Signed and Sealed this

Fourth Day of October, 2005

JON W. DUDAS
*Director of the United States Patent and Trademark Office*